(12) United States Patent
Chen et al.

(10) Patent No.: US 11,843,423 B2
(45) Date of Patent: Dec. 12, 2023

(54) BROADBAND MEASUREMENT SYSTEM AND MEASUREMENT METHOD FOR BROADBAND PROPERTY

(71) Applicant: TMY Technology Inc., Taipei (TW)

(72) Inventors: Wei-Yang Chen, Taipei (TW); Ssu-Han Liu, Taipei (TW); Wan-Yu Chu, Taipei (TW); Han-Ti Chuang, Taipei (TW)

(73) Assignee: TMY Technology Inc., Taipei (TW)

( * ) Notice: Subject to any disclaimer, the term of this patent is extended or adjusted under 35 U.S.C. 154(b) by 0 days.

(21) Appl. No.: 17/881,626

(22) Filed: Aug. 5, 2022

(65) Prior Publication Data

US 2023/0075278 A1    Mar. 9, 2023

Related U.S. Application Data

(60) Provisional application No. 63/241,503, filed on Sep. 7, 2021.

(30) Foreign Application Priority Data

Dec. 30, 2021 (TW) ................................ 110149525

(51) Int. Cl.
*H04B 17/00* (2015.01)
*G01R 31/28* (2006.01)

(52) U.S. Cl.
CPC ................................ *H04B 17/0085* (2013.01)

(58) Field of Classification Search
CPC ........................ H04B 17/0085; G01R 31/2822
See application file for complete search history.

(56) References Cited

U.S. PATENT DOCUMENTS 5,020,148 A  *  5/1991  Bonato  ................ H03D 9/0633
                                                455/317
5,773,985 A  *  6/1998  Bradley  ................ G01R 27/28
                                                324/646

(Continued)

FOREIGN PATENT DOCUMENTS

CN        111220847        6/2020
CN        112636843        4/2021

(Continued)

OTHER PUBLICATIONS

"Office Action of Taiwan Counterpart Application", dated Oct. 17, 2022, p. 1-p. 4.

(Continued)

*Primary Examiner* — Dominic E Rego
(74) *Attorney, Agent, or Firm* — JCIPRNET

(57) ABSTRACT

A broadband measurement system and a measurement method for broadband property are provided. The signal measurement apparatus is used to transmit a measuring signal belonging to a first frequency domain from its measuring port. Two ports of the signal converter are used to connect with two measuring ports of the signal measurement apparatus. The first passive mixer of the signal converter is configured as bidirectional, and the second passive mixer of the signal converter is configured as bidirectional. Two mixers are used to convert the signals from the first frequency domain into a second frequency domain, and convert the signals from the second frequency domain into the first frequency domain.

11 Claims, 19 Drawing Sheets

(56) References Cited

U.S. PATENT DOCUMENTS

| | | | |
|---|---|---|---|
| 7,043,099 B1* | 5/2006 | Watanabe | H04B 10/2531 |
| | | | 385/11 |
| 9,244,111 B2* | 1/2016 | Clarridge | G01R 31/52 |
| 10,145,930 B1 | 12/2018 | Betts et al. | |
| 10,374,675 B1* | 8/2019 | Marr | H01Q 3/36 |
| 10,439,924 B2* | 10/2019 | Ince | H04L 43/12 |
| 11,079,413 B2* | 8/2021 | Bertin | G01L 1/2262 |
| 2005/0216213 A1 | 9/2005 | Sternberg et al. | |
| 2008/0197293 A1* | 8/2008 | Xu | B62D 1/00 |
| | | | 250/491.1 |
| 2012/0109566 A1* | 5/2012 | Adamian | G01R 27/28 |
| | | | 702/107 |
| 2013/0147500 A1 | 6/2013 | McCune, Jr. | |
| 2015/0115165 A1* | 4/2015 | Tsuda | H01J 47/02 |
| | | | 250/374 |
| 2015/0198523 A1* | 7/2015 | Dunsmore | G01R 35/005 |
| | | | 356/446 |
| 2016/0364354 A1* | 12/2016 | Lin | G06F 13/4022 |
| 2017/0074911 A1* | 3/2017 | Zietz | G01R 35/005 |
| 2019/0146012 A1* | 5/2019 | Veil | G05B 9/03 |
| | | | 702/64 |
| 2019/0162767 A1* | 5/2019 | Wang | G01R 31/2822 |
| 2020/0103458 A1 | 4/2020 | Anderson et al. | |
| 2021/0348960 A1* | 11/2021 | Cheung | G01F 23/266 |

FOREIGN PATENT DOCUMENTS

| | | |
|---|---|---|
| CN | 112798862 | 5/2021 |
| CN | 113411147 | 9/2021 |
| TW | 200912352 | 3/2009 |
| TW | I470248 | 1/2015 |
| TW | 202109064 | 3/2021 |

OTHER PUBLICATIONS

Victor Hugo Bueno Preuss et al., "A Study on Low-Cost Calibration Kits for U.FL Connector Systems", 2019 4th International Symposium on Instrumentation Systems, Circuits and Transducers (INSCIT), IEEE, Aug. 26, 2019, pp. 1-6.

Ballo D, "Applying Error Correction To Network Analyzer Measurements", Microwave Journal, Horizon House Publications, Norwood, MA, US, vol. 41, No. 3, Mar. 1, 1998, pp. 1-11.

Keysight, "mm-Wave Frequency Extension for Vector Network Analyzers", Apr. 17, 2015, pp. 1-2. Available at: https://literature.cdn.keysight.com/litweb/pdf/5990-9610EN.pdf?id:2166536.

"Search Report of Europe Counterpart Application", dated Aug. 16, 2022, p. 1-p. 13.

"Office Action of Japan Counterpart Application", dated Sep. 19, 2023, p. 1-p. 3.

* cited by examiner

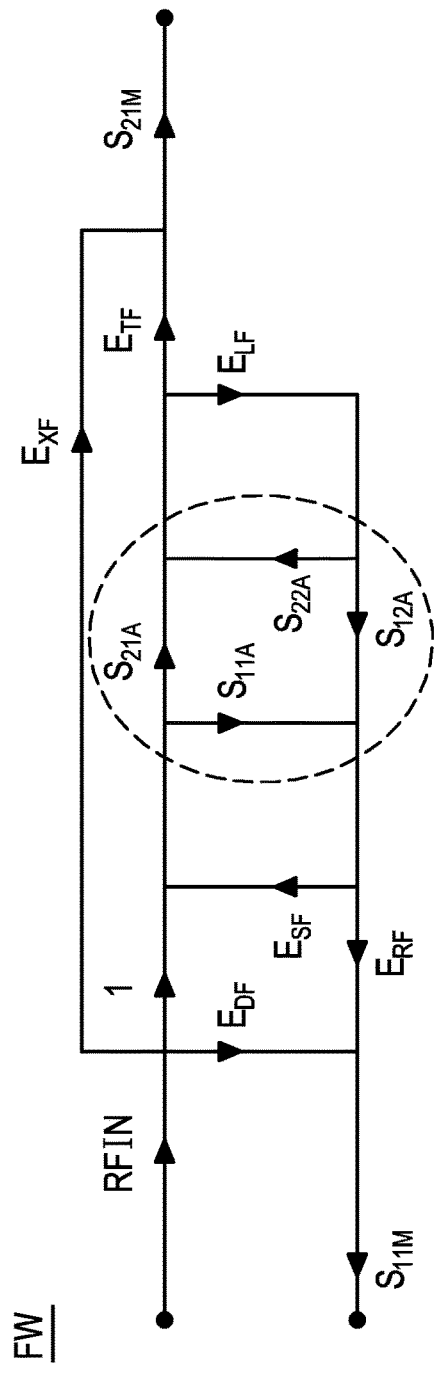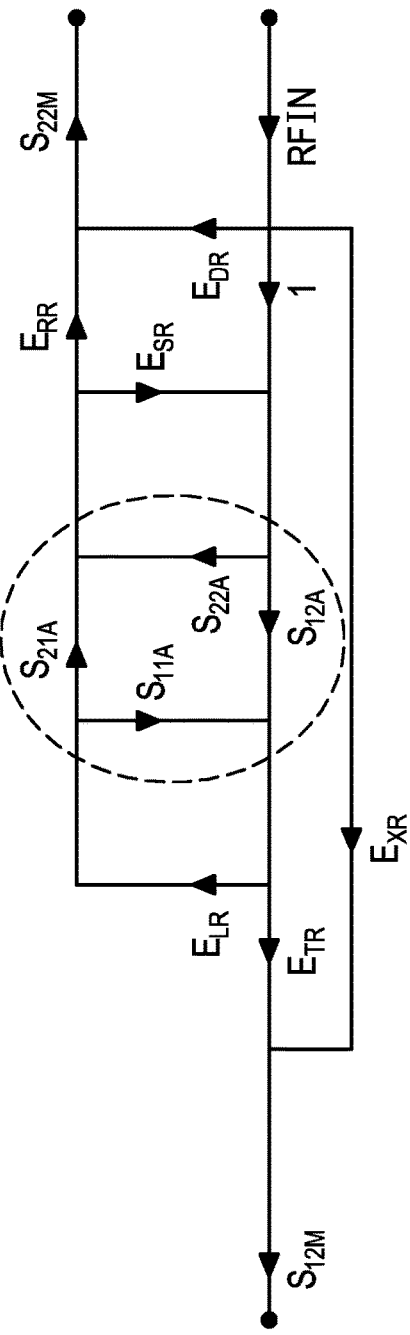
FIG. 5A
FIG. 5B

BROADBAND MEASUREMENT SYSTEM AND MEASUREMENT METHOD FOR BROADBAND PROPERTY

CROSS-REFERENCE TO RELATED APPLICATION

This application claims the priority benefit of U.S. provisional application Ser. No. 63/241,503, filed on Sep. 7, 2021, and Taiwan application serial no. 110149525, filed on Dec. 30, 2021. The entirety of each of the above-mentioned patent applications is hereby incorporated by reference herein and made a part of this specification.

BACKGROUND

Technology Field

The disclosure relates to a measurement technology, and particularly to a broadband measurement system and a measurement method for broadband property.

Description of Related Art

As wireless communication gradually develops into the millimeter wave frequency band, the demand for high-frequency measurement has increased. However, many academic agencies or industrial research units still only hold low-frequency or intermediate-frequency network analyzers and cannot support high-frequency measurement. However, high-frequency/broadband network analyzers require many electronic devices suitable for broadband operation (e.g., ultra-wideband phase-locked loops, ultra-wideband switching switches), which are difficult to manufacture and therefore difficult to promote.

SUMMARY

In view of this, the embodiments of the disclosure provide a broadband measurement system and a measurement method for broadband property allowing a low-frequency network analyzer to implement high-frequency measurement.

The broadband measurement system of the embodiments of the disclosure includes (but is not limited to) a signal measurement apparatus and a signal converter. The signal measurement apparatus includes a first measuring port and a second measuring port. The signal measurement apparatus is configured to send a measuring signal from the first measuring port or the second measuring port, and a frequency of the measuring signal belongs to a first frequency domain. The signal converter includes a first port, a second port, a third port, a fourth port, a first passive mixer, and a second passive mixer. The first port is configured to be connected to the first measuring port of the signal measurement apparatus. The third port is configured to be connected to the second measuring port of the signal measurement apparatus. The first passive mixer is coupled between the first port and the second port and configured as bidirectional. The second passive mixer is coupled between the third port and the fourth port and configured as bidirectional.

The measurement method for broadband property of the embodiments of the disclosure includes (but is not limited to) steps as follows. The signal converter as mentioned is provided. A signal measurement apparatus is connected to one side of the signal converter. A calibration kit is electrically connected to another side of the signal converter to obtain at least one group of calibration kit measurement values related to the calibration kit by performing a calibration process. An error model based on the at least one group of the calibration kit measurement values is established. The signal measurement apparatus is electrically connected to a device under test (DUT) through the signal converter to obtain at least one group of device-under-test measurement values related to the device under test (DUT). The at least one group of the device-under-test measurement values is calibrated to at least one group of property values of the device under test according to the error model.

In summary, according to the broadband measurement system and the measurement method for broadband property of the embodiments of the disclosure, a signal converter is combined with a signal measurement apparatus to implement measurement in a different frequency domain.

BRIEF DESCRIPTION OF THE DRAWINGS

FIG. 5A is a schematic view of a signal flow analysis of a forward error model according to an embodiment of the disclosure.

FIG. 5B is a schematic view of a signal analysis of a reverse error model according to an embodiment of the disclosure.

DESCRIPTION OF THE EMBODIMENTS

Figure 1:
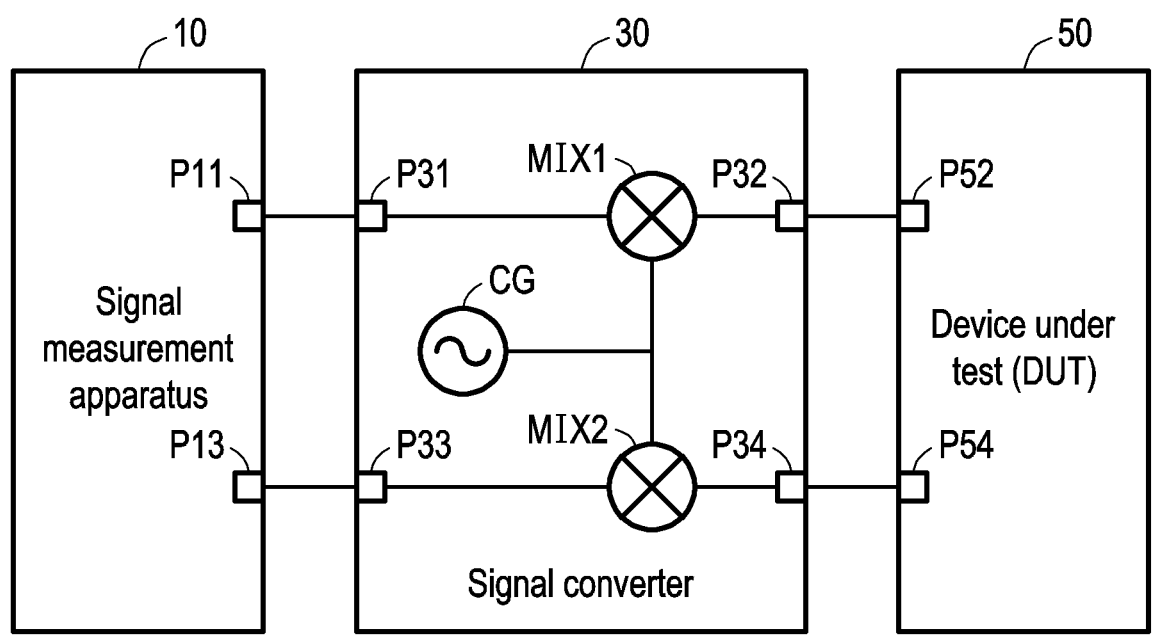
FIG. 1 is a block view of components of a broadband measurement system according to an embodiment of the disclosure.

FIG. 1 is a block view of components of a broadband measurement system 1 according to an embodiment of the disclosure. Referring to FIG. 1, the broadband measurement system 1 includes (but is not limited to) a signal measurement apparatus 10 and a signal converter 30. In an embodiment, the broadband measurement system 1 is electrically connected to a device under test (DUT) 50 during measurement.

The signal measurement apparatus 10 may be a vector network analyzer (VNA) or other instruments for verifying parameters such as impedance parameters (Z parameters), admittance parameters (Y parameters), mixing parameters (h parameters/g parameters), transmission parameters (ABCD parameters), scattering parameters (S parameters), or scattering transmission parameters (T Parameters). In an embodiment, the signal measurement apparatus 10 includes measuring ports P11 and P13 and is configured to send measuring signals from the measuring port P11 or the measuring port P13. That is, the signal measurement apparatus 10 provides a single port measurement or a dual-port measurement. In an embodiment, the measuring signal belongs to the first frequency domain. For example, the first frequency domain ranges from 0 to 8 GHz or from 2 to 6 GHz, but the disclosure is not limited thereto.

The signal converter 30 may be a up/down converter or other converters for adjusting the signal frequency/frequency domain. The signal converter 30 includes a signal generator CG and passive mixers MIX1 and MIX2.

The signal generator CG is coupled to the passive mixers MIX1 and MIX2 and configured to generate a reference signal. In an embodiment, the signal generator CG provides the passive mixer MIX1 or the passive mixer MIX2 with a reference signal (or a clock signal, a local oscillator (LO) signal). In an embodiment, the frequency of the reference signal is related to the frequency difference between the input and output of the passive mixers MIX1 and MIX2. In some embodiments, the frequency of the reference signal can be changed according to requirements or a fixed value.

In an embodiment, the signal converter 30 includes ports P31, P32, P33, and P34. The passive mixer MIX1 is coupled between the port P31 and the port P32. The passive mixer MIX2 is coupled between the port P33 and the port P34. In addition, the ports P31 and P33 are configured to be connected to the measuring ports P11 and P13 of the signal measurement apparatus 10, respectively. The ports P32 and P34 are configured to be connected to a port under test P52 and a port under test P54 of the DUT 50, respectively.

Figure 2A:
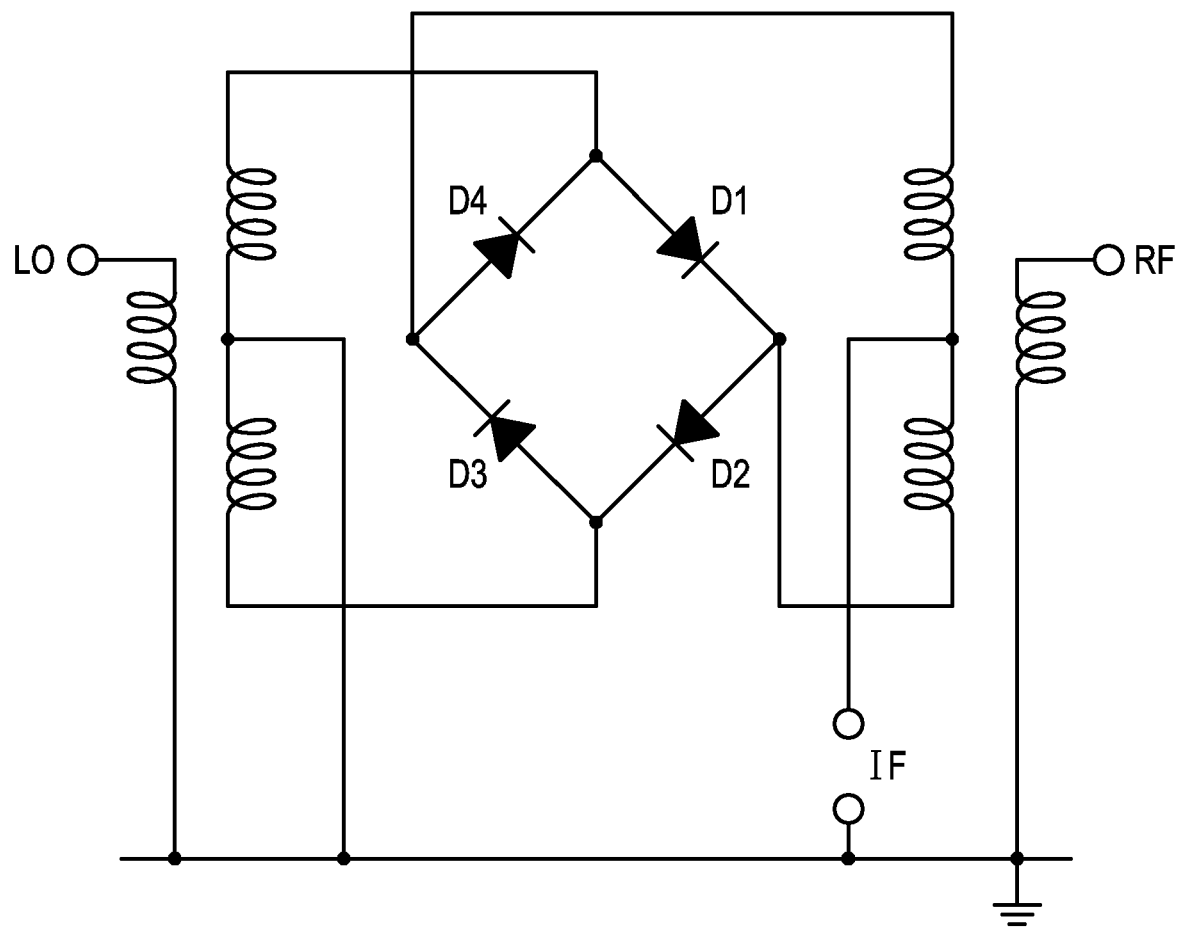
FIG. 2A is a circuit diagram of a passive mixer according to an embodiment of the disclosure.

The passive mixers MIX1 and MIX2 can be implemented by circuits. For example, FIG. 2A is a circuit diagram of a passive mixer according to an embodiment of the disclosure. Referring to FIG. 2A, the passive mixer includes switches D1, D2, D3, and D4. The switches D1, D2, D3, and D4 are illustrated as diodes in the drawing. An endpoint LO is configured to be connected to the signal generator CG. An endpoint RF is configured to be connected to the DUT 50. In addition, an endpoint IF is configured to be connected to the signal measurement apparatus 10.

Figure 2B:
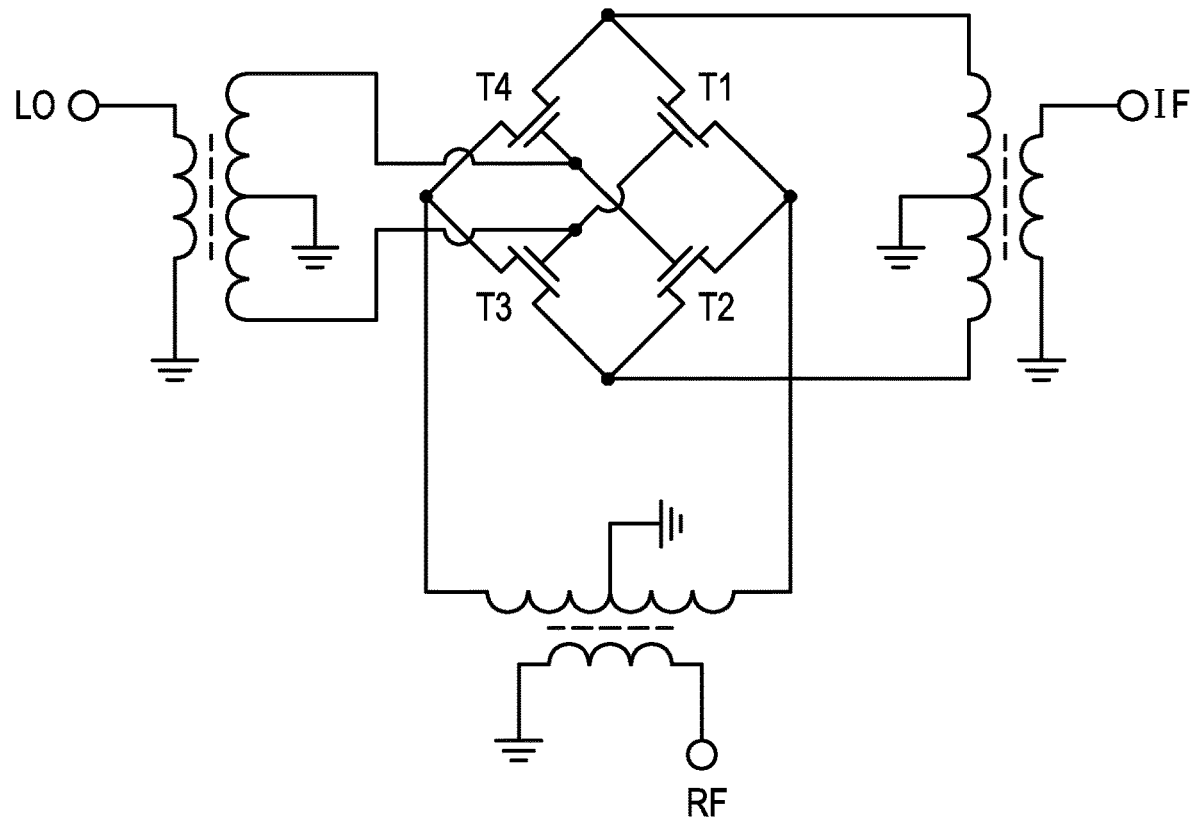
FIG. 2B is a circuit diagram of a passive mixer according to another embodiment of the disclosure.

FIG. 2B is a circuit diagram of a passive mixer according to another embodiment of the disclosure. Referring to FIG. 2B, what differs from FIG. 2A is that the passive mixer includes switches T1, T2, T3, and T4. The switches T1, T2, T3, and T4 are illustrated as transistors in the drawing. In addition, the control terminal (e.g., gate) of the switch T1 is connected to the control terminal of the switch T3, and the control terminal of the switch T2 is connected to the control terminal of the switch T4.

A switch-type mixer circuit is illustrated in FIG. 2A and FIG. 2B. However, in other embodiments, the passive mixers MIX1 and MIX2 may also be other switched passive mixers or other types of mixers.

The passive mixers MIX1 and MIX2 are all configured as bidirectional. For example, the passive mixer MIX1 mixes the signal from the port P31 and outputs the mixed signal through the port P32, and the passive mixer MIX2 mixes the signal from the port P33 and outputs the mixed signal through the port P34. In another example, the passive mixer MIX1 mixes the signal from the port P32 and outputs the mixed signal through the port P31, and the passive mixer MIX2 mixes the signal from the port P34 and outputs the mixed signal through the port P33.

In an embodiment, the signal from the port P31 is converted to the second frequency domain and output from the port P32 by the passive mixer MIX1. If the port P31 is connected to the measuring port P11 of the signal measurement apparatus 10 and the measuring signal output by the signal measurement apparatus 10 belongs to the first frequency domain, the passive mixer MIX1 converts the signal from the first frequency domain to the second frequency domain. The second frequency domain may range from 20 to 30 GHz or from 10 to 30 GHz, but the disclosure is not limited thereto.

In one embodiment, the signal from the port P32 is converted to the first frequency domain and output from the port P31 by the passive mixer MIX1. If the port P32 is connected to the port under test P52 of the DUT 50 and the signal output by the DUT 50 belongs to the second frequency domain, the passive mixer MIX1 converts the signal from the second frequency domain to the first frequency domain.

In one embodiment, the signal from the port P33 is converted to the second frequency domain and output from the port P34 by the passive mixer MIX2. If the port P33 is connected to the measuring port P13 of the signal measurement apparatus 10 and the measuring signal output by the signal measurement apparatus 10 belongs to the first frequency domain, the passive mixer MIX2 converts the signal from the first frequency domain to the second frequency domain.

In one embodiment, the signal from the port P34 is converted to the first frequency domain and output from the port P33 by the passive mixer MIX2. If the port P34 is connected to the port under test P54 of the DUT 50 and the signal output by the DUT 50 belongs to the second frequency domain, the passive mixer MIX2 converts the signal from the second frequency domain to the first frequency domain.

For example, the ports P31 and P33 are intermediate frequency (IF) ports, and the ports P32 and P34 are radio frequency (RF) ports. That is, the signals from the ports P31 and P33 are intermediate frequency signals (belonging to the first frequency domain), and the passive mixers MIX1 and MIX2 up-convert the intermediate frequency signals and output RF signals (belonging to the second frequency domain) (i.e., converting an intermediate frequency signal into a high frequency signal) through the ports P32 and P34. Alternatively, the signals from the ports P32 and P34 are radio frequency signals, and the passive mixers MIX1 and MIX2 down-convert the radio frequency signals and output intermediate frequency signals through the ports P31 and P33 (i.e., converting a high frequency signal an into intermediate frequency signal).

Note that, according to different design requirements, the ranges of the first frequency domain and the second frequency domain are still subject to change, and the embodiment of the disclosure is not limited thereto.

The DUT 50 can be any type of radio frequency signal generating devices, microwave signal generating devices, or antenna devices. In one embodiment, the DUT 50 includes the port under test P52 and the port under test P54.

Figure 3:
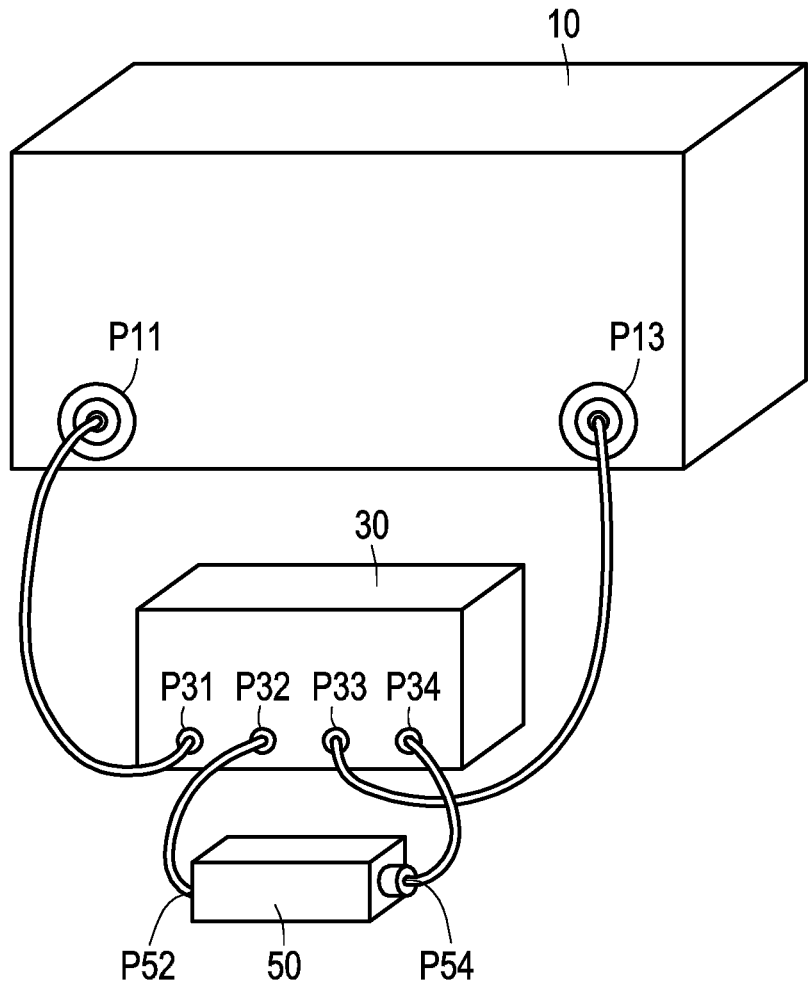
FIG. 3 is a schematic view of a broadband measurement system according to an embodiment of the disclosure.

FIG. 3 is a schematic view of the broadband measurement system 1 according to an embodiment of the disclosure. Referring to FIG. 3, the ports P31 and P33 of the signal converter 30 are connected to the measuring ports P11 and P13 of the signal measurement apparatus 10, respectively, and the ports P32 and P34 of the signal converter 30 are connected to the port under test P52 and the port under test P54 of the DUT 50, respectively.

Note that a calibration process needs to be performed before measuring the DUT 50. For example, in the broadband measurement system 1, the measuring ports P11 and P13 of the signal measurement apparatus 10 are connected to the port under test P52 and the port under test P54 of the DUT 50, respectively. The measurement planes are located at the measuring ports P11 and P13, respectively. Generally speaking, the factor resulting in unexpected effects is that the system error is caused by the defect of the signal measurement apparatus 10 and/or the test configuration (e.g., cables, connectors, or fixtures). The calibration process is to translate the measurement plane from the port end of the signal measurement apparatus 10 to the port end of the DUT 50. That is, the calibration reference planes are located at the port under test P52 and the port under test P54, respectively. Accordingly, unexpected effects caused by the system can be eliminated, and the property of the DUT 50 (e.g., the property value of the device under test) can be measured more accurately.

Figure 4:
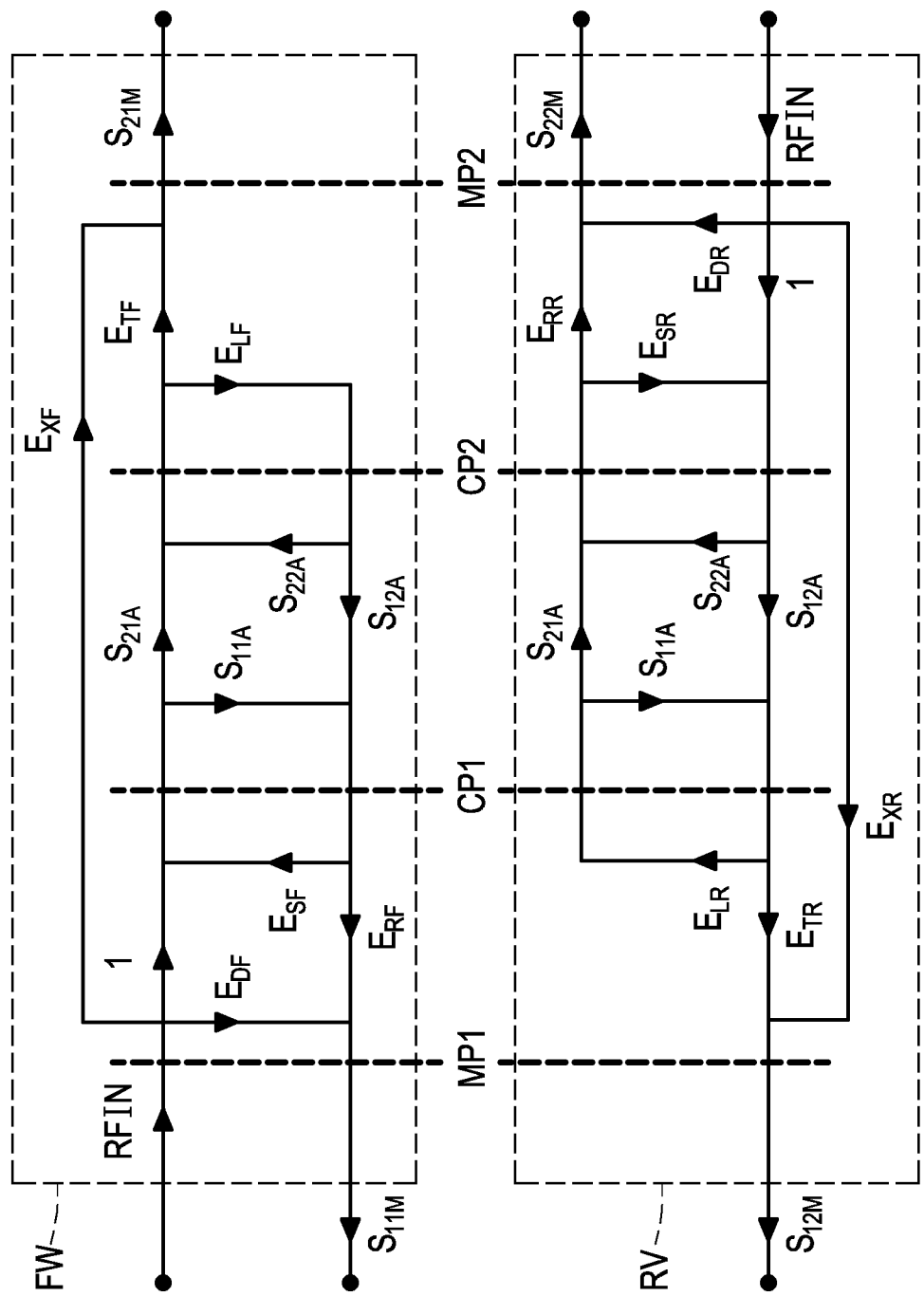
FIG. 4 is a schematic view of a forward error model and a reverse error model according to an embodiment of the disclosure.

FIG. 4 is a schematic view of a forward error model FW and a reverse error model RV according to an embodiment of the disclosure. Referring to FIG. 4, if the port end of the signal measurement apparatus 10 to the port end of the DUT 50 is regarded as a dual-port network, the dual-port error models FW and RV of forward propagation and reverse propagation can be formed. By calibrating, measurement planes MP1 and MP2 is translated from the port end of the signal measurement apparatus 10 to the port end of the DUT 50, and the actual property (hereinafter referred to as the property value of the device under test) of the DUT 50 can be measured. That is, the calibration reference planes CP1 and CP2 are located at the port ends of the DUT 50. The errors caused by the signal leakage in the system 1 can be summarized into a directivity error and a crosstalk error. Various errors are divided into forward propagation and reverse propagation, so 4 error terms (i.e., error terms $E_{DF}$, $E_{DR}$, $E_{XF}$, $E_{XR}$) can be obtained. The subscript prefix D of the error term represents directivity error, and X represents crosstalk error. The subscript suffix F of the error term represents forward propagation, and R represents reverse propagation.

The error caused by the signal mismatch in System 1 can be summarized into a source match error and a load match error. Various errors are also divided into forward propagation and reverse propagation, so 4 error terms (i.e., error terms $E_{SF}$, $E_{SR}$, $E_{LF}$, $E_{LR}$) can be obtained. The subscript prefix S of the error term represents the source match error, and L represents the load match error.

In addition, in response to the caused error, the frequency of the receiver in the signal measurement apparatus 10 can be summarized as reflection tracking error and a transmission tracking error. Various errors are also divided into forward propagation and reverse propagation, so 4 error terms (i.e., error terms $E_{RF}$, $E_{RR}$, $E_{TF}$, $E_{TR}$) can be obtained. The subscript prefix R of the error term represents the reflection tracking error, and T represents the transmission tracking error.

The twelve error terms caused by the leakage, mismatch, and frequency response can be used to analyze the dual-port error model.

Specifically, FIG. 5A is a schematic view of signal flow analysis of a forward error model FW according to an embodiment of the disclosure. Referring to FIG. 5A, Mason's rule/Mason's Gain Formula is a rule used to describe the relationship between nodes and can be used to analyze the signal flow of the dual-port error model. According to the forward error model FW of the forward propagation, the formulas of the reflection coefficient $S_{11M}$ and the transmission coefficient $S_{21M}$ (i.e., the calibration kit measurement value) obtained by measuring the DUT 50 without calibration can be obtained:

$$S_{11M} = E_{DF} + \frac{S_{11A} - E_{LF} \cdot (S_{11A} \cdot S_{22A} - S_{21A} \cdot S_{12A})}{1 - E_{SF} \cdot S_{11A} - E_{LF} \cdot S_{22A} + E_{SF} \cdot E_{LF} \cdot (S_{11A} \cdot S_{22A} - S_{21A} \cdot S_{12A})} \quad (1)$$

$$S_{21M} = E_{XF} + \frac{E_{TF} \cdot S_{21A}}{1 - E_{SF} \cdot S_{11A} - E_{LF} \cdot S_{22A} + E_{SF} \cdot E_{LF} \cdot (S_{11A} \cdot S_{22A} - S_{21A} \cdot S_{12A})} \quad (2)$$

FIG. 5B is a schematic view of signal analysis of a reverse error model RV according to an embodiment of the disclosure. Referring to FIG. 5B, according to the reverse error model RV of the reverse propagation, the formulas of the reflection coefficient $S_{22M}$ and the transmission coefficient $S_{12M}$ (i.e., the calibration kit measurement value) obtained by measuring the DUT 50 without calibration can be obtained:

$$S_{22M} = E_{DR} + \frac{S_{11A} - E_{LR} \cdot (S_{11A} \cdot S_{22A} - S_{21A} \cdot S_{12A})}{1 - E_{SR} \cdot S_{22A} - E_{LR} \cdot S_{11A} + E_{SR} \cdot E_{LR} \cdot (S_{11A} \cdot S_{22A} - S_{21A} \cdot S_{12A})} \quad (3)$$

$$S_{12M} = E_{XR} + \frac{E_{TR} \cdot S_{12A}}{1 - E_{SR} \cdot S_{22A} - E_{LR} \cdot S_{11A} + E_{SR} \cdot E_{LR} \cdot (S_{11A} \cdot S_{22A} - S_{21A} \cdot S_{12A})} \quad (4)$$

Based on the four formulas (1)-(4), SOLT calibration can be performed to obtain various error terms. If the error terms are substituted back into the four formulas (1)-(4), the actual S-parameter (i.e., the property value of the device under test) of the DUT 50 can be obtained, that is, the (calibrated) parameters $S_{11A}$, $S_{22A}$, $S_{21A}$, and $S_{12A}$.

Figure 6A:
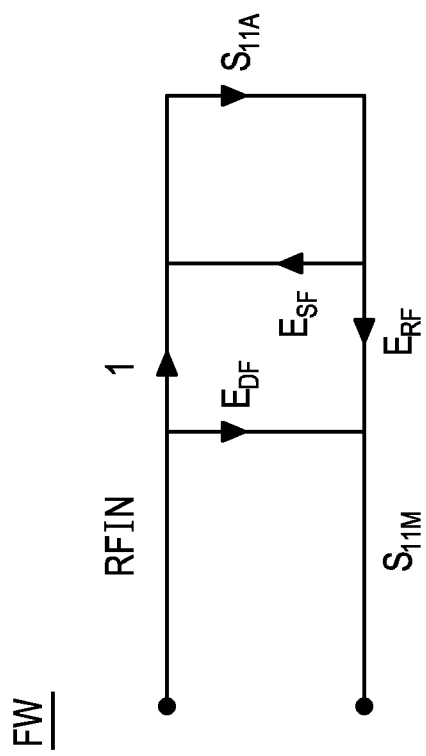
FIG. 6A is a schematic view of a simplified forward model for single port calibration according to an embodiment of the disclosure.
Figure 6B:
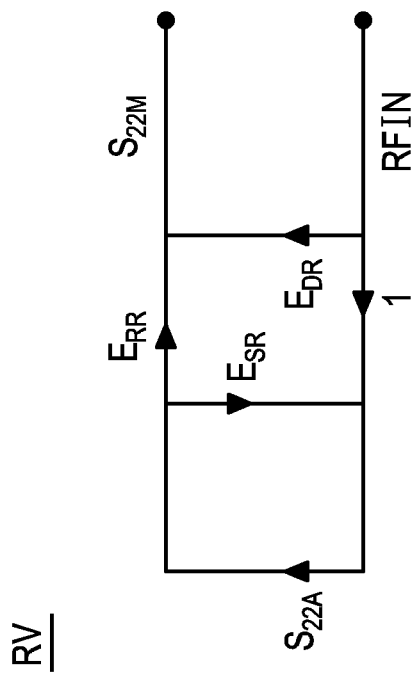
FIG. 6B is a schematic view of a simplified reverse model for single port calibration according to an embodiment of the disclosure.

Then, for the calibration process of SOLT, first signal port calibration (including short circuit, open circuit, and load) is performed. Meanwhile, the measuring port is not connected, so in the embodiment, it is assumed that the parameter, $S_{21A}$ and $S_{12A}$ is 0. FIG. 6A is a schematic view of a simplified forward model for single port calibration according to an embodiment of the disclosure, and FIG. 6B is a schematic view of a simplified reverse model for single port calibration according to an embodiment of the disclosure. Referring to FIG. 6A and FIG. 6B, the simplified model can get the following formula:

$$S_{11M} = E_{DF} + E_{RF} \cdot \frac{S_{11A}}{1 - E_{SF} \cdot S_{11A}} \quad (5)$$

$$S_{22M} = E_{DR} + E_{RR} \cdot \frac{S_{22A}}{1 - E_{SR} \cdot S_{22A}}. \quad (6)$$

The unconnected measuring port can be electrically connected to a calibration kit (e.g., short circuit calibration kit, open circuit calibration kit, and load calibration kit) to obtain one or more groups of calibration kit measurement values by performing the calibration process (the calibration sequence can be changed according to requirements).

For load calibration, if the load calibration kit is connected and can be completely matched, the reflection coefficient approaches 0 (e.g., $S_{11A}=S_{22A}\cong 0$). Substituting the condition that the reflection coefficient is 0 into formulas (5) and (6), it can be obtained that the error term $E_{DF}$ is equal to the reflection coefficient $S_{11ML}$ (i.e., $E_{DF}=S_{11ML}$) measured when the load calibration kit is connected but not calibrated, and the error term $E_{DR}$ is equal to the reflection coefficient $S_{22ML}$ (i.e., $E_{RF}=S_{22ML}$) (i.e., calibration kit measurement value) measured when the load calibration kit is connected but not calibrated.

In addition, by connecting the load calibration kit, the error terms $E_{XF}$ and $E_{XR}$ related to isolation can be obtained. The error term $E_{XF}$ is equal to the penetration coefficient $S_{21ML}$ (i.e., $E_{XF}=S_{21ML}$) measured when the load calibration kit is connected but not calibrated, and the error term $E_{XR}$ is equal to the penetration coefficient $S_{12ML}$ (i.e., $E_{XF}=S_{12ML}$) (i.e., calibration kit measurement value) measured when the load calibration kit is connected but not calibrated. Since it is actually impossible to measure the penetration coefficients $S_{21ML}$ and $S_{12ML}$, it may not be included in the formula in the subsequent process.

In one embodiment, during the process of establishing the error model, some of one or more groups of measurement values can be set according to the parameters of the calibration kit to establish the error model. That is, one or more of the calibration kit measurement values (e.g., reflection coefficient or transmission coefficient) (as a measurement boundary condition) of a particular type of calibration kit can be substituted into the error term to estimate the error model.

In another embodiment, in the process of establishing the error model, some of one or more groups of calibration kit measurement values can be set according to the theoretical model to establish the error model. The theoretical model is the reflection coefficient and/or penetration coefficient of a specific calibration kit in an ideal state. That is, one or more of the ideal measurement values (e.g., reflection coefficient or transmission coefficient) (as measurement boundary conditions) of a particular type of calibration kit can be substituted in the error term to estimate the error model.

For example, for open circuit and short circuit calibration, forward propagation can be considered first. By solving the formulas (5) and (6) simultaneously, the error terms $E_{RF}$ and $E_{SF}$ can be obtained (assuming the ideal boundary condition of the ideal model is open circuit: $S_{11AO}=S_{22AO}\cong 1$; short circuit: $S_{11AS}=S_{22AS}\cong -1$).

$$E_{RF} = \frac{\frac{(S_{11MO} - E_{DF})(S_{11MS} - E_{DF})}{S_{11AO}} - \frac{(S_{11MS} - E_{DF})(S_{11MO} - E_{DF})}{S_{11AS}}}{S_{11MO} - S_{11MS}} \quad (7)$$

$$E_{SF} = \frac{\frac{S_{11MO} - E_{DF}}{S_{11AO}} - \frac{S_{11MS} - E_{DF}}{S_{11AS}}}{S_{11MO} - S_{11MS}}. \quad (8)$$

The reflection coefficient of an ideal open circuit is 1, and the reflection coefficient of an ideal short circuit is −1. However, the actual reflection coefficient is usually not so ideal. If the ideal value is substituted into formulas (7) and (8), the calculated result may be in error with the actual value. In order to make the calculation result closer to the actual measurement result, the actual measured reflection coefficients (i.e., the calibration kit measurement values) of the open circuit calibration kit and short circuit calibration kit obtained after the calibration obtained from the signal measurement apparatus 10 can be directly substituted into the parameters $S_{11AO}$ and $S_{11AS}$ of the formula (7) and (8) to obtain the value of the error terms $E_{RF}$ and $E_{SF}$.

Next, the reverse propagation is considered. By solving the formulas (5) and (6) simultaneously, the error terms $E_{RR}$ and $E_{SR}$ can be obtained (assuming that the ideal boundary condition is open circuit: $S_{11AO}=S_{22AO}\cong 1$; short circuit: $S_{11AS}=S_{22AS}\cong -1$).

$$E_{RR} = \frac{\frac{(S_{22MO} - E_{DR})(S_{22MS} - E_{DR})}{S_{22AO}} - \frac{(S_{22MS} - E_{DR})(S_{22MO} - E_{DR})}{S_{22AS}}}{S_{22MO} - S_{22MS}} \quad (9)$$

$$E_{SR} = \frac{\frac{S_{22MO} - E_{DR}}{S_{22AO}} - \frac{S_{22MS} - E_{DR}}{S_{22AS}}}{S_{22MO} - S_{22MS}}. \quad (10)$$

Similarly, to make the calculation result closer to the actual measurement result, the reflection coefficients (i.e., the calibration kit measurement values) (as a measurement boundary condition) of the open circuit calibration kit and short circuit calibration kit obtained after the calibration obtained from the signal measurement apparatus 10 can be directly substituted into the parameters $S_{22AO}$ and $S_{22AS}$ of formulas (9) and (10) to obtain the values of the error termer $E_{RR}$ and $E_{SR}$.

Figure 7A:
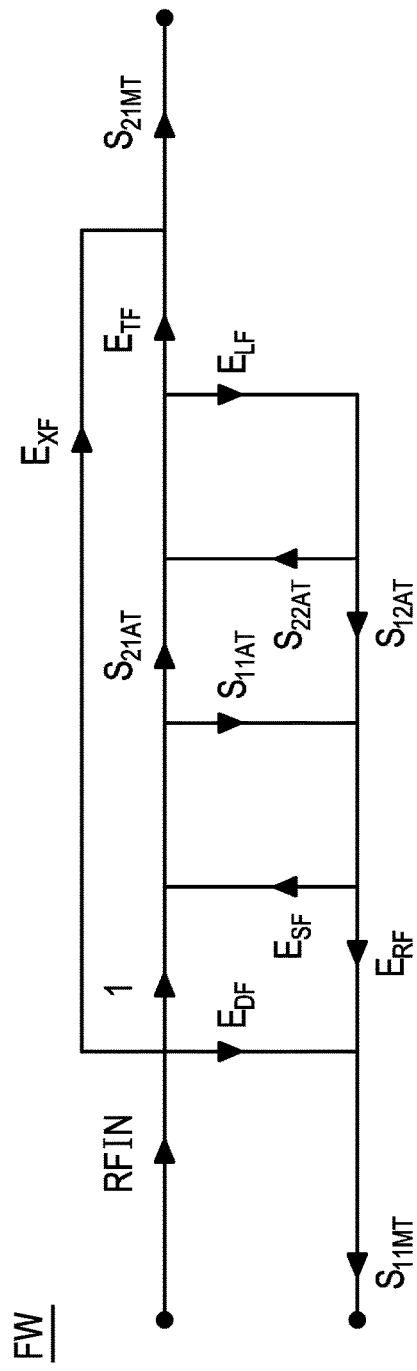
FIG. 7A is a schematic view of a forward signal analysis for dual-port calibration according to an embodiment of the disclosure.
Figure 7B:
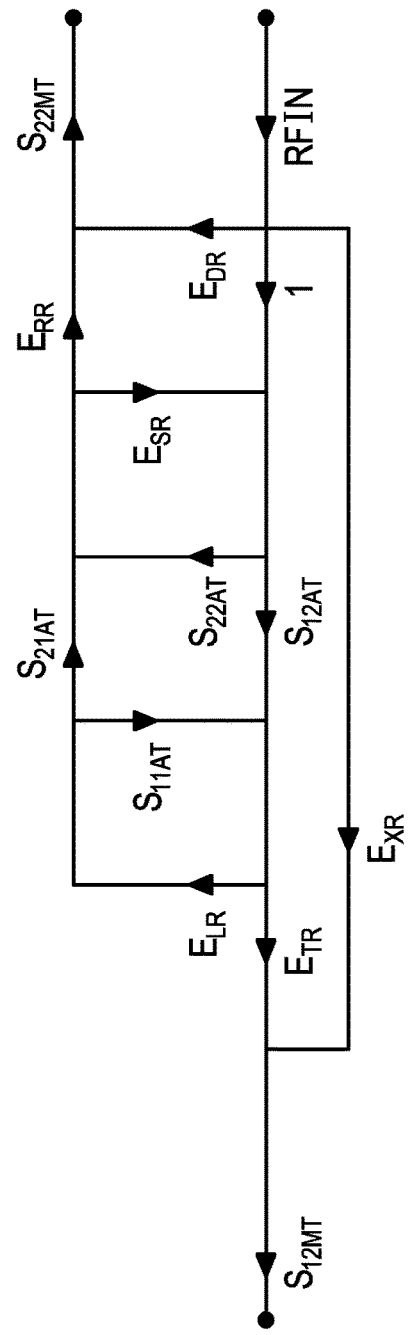
FIG. 7B is a schematic view of a reverse signal analysis for dual-port calibration according to an embodiment of the disclosure.

Then, for the through connection dual-port calibration, FIG. 7A is a schematic view of a forward signal analysis for dual-port calibration according to an embodiment of the disclosure, and FIG. 7B is a schematic view of a reverse signal analysis for dual-port calibration according to an embodiment of the disclosure. Referring to FIG. 7A and FIG. 7B, a dual-port error model is illustrated assuming that a through connection calibration kit is used as the DUT (or the DUT 50). From formulas (1) and (3) (assuming that ideal boundary conditions are through connection: $S_{11AT}=S_{22AT}\cong 0$; $S_{21AT}=S_{12AT}\cong 1$), the error terms $E_{LF}$ and $E_{LR}$ can be obtained:

$$E_{LF} = \frac{(S_{11M} - E_{DF}) - (S_{11M} - E_{DF})(E_{SF} \cdot S_{11AT}) - E_{RF} \cdot S_{11AT})}{(S_{11MT} - E_{DF})S_{11AT} - E_{SF}(S_{11MT} - E_{DF})} \quad (11)$$
$$(S_{11AT} \cdot S_{22AT} - S_{21AT} \cdot S_{12AT}) - E_{RF} \cdot (S_{11AT} \cdot S_{22AT} - S_{21AT} \cdot S_{12AT})$$

$$E_{LR} = \frac{(S_{22M} - E_{DR}) - (S_{22M} - E_{DR})(E_{SR} \cdot S_{22AT}) - E_{RR} \cdot S_{22AT})}{(S_{22MT} - E_{DR})S_{22AT} - E_{SR}(S_{22MT} - E_{DR})} \quad (12)$$
$$(S_{11AT} \cdot S_{22AT} - S_{21AT} \cdot S_{12AT}) - E_{RR} \cdot (S_{11AT} \cdot S_{22AT} - S_{21AT} \cdot S_{12AT})$$

The reflection coefficient of the ideal through connection is 0, and the reflection coefficient is 1. However, in practice, calibration kits are often difficult to implement the ideal through. To make the calculation result closer to the actual measurement result, the reflection coefficient and transmission coefficient (i.e., the calibration kit measurement value) (as the measurement boundary condition) of the through connection calibration kit obtained after calibration obtained from the signal measurement apparatus 10 can be directly substituted into the parameters $S_{11AT}$, $S_{22AT}$, $S_{21AT}$, and $S_{12AT}$ of formulas (11) and (12) to obtain the value of the error term $E_{LF}$ and $E_{LR}$.

In addition, from formulas (2) and (4) (assuming that the ideal boundary conditions are through connection: $S_{11AT}=S_{22AT}\cong0$; $S_{21AT}=S_{12AT}\cong1$), the error terms $E_{TF}$ and $E_{TR}$ can be obtained:

$$E_{TF} = \frac{S_{21M} \cdot (1 - E_{SF} \cdot S_{11AT} - E_{LF} \cdot S_{22AT} + E_{SF}E_{LF} \cdot (S_{11AT} \cdot S_{22AT} - S_{21AT} \cdot S_{12AT}))}{S_{21AT}} \quad (13)$$

$$E_{TR} = \frac{S_{12M} \cdot (1 - E_{SR} \cdot S_{22AT} - E_{LR} \cdot S_{11AT} + E_{SR} \cdot E_{LR} \cdot (S_{11AT} \cdot S_{22AT} - S_{21AT} \cdot S_{12AT}))}{S_{12AT}}. \quad (14)$$

Similarly, to make the calculation result closer to the actual measurement result, the reflection coefficient and transmission coefficient (i.e., the calibration kit measurement value) (as the measurement boundary condition) of the through connection calibration kit actually measured after the calibration and obtained from the signal measurement apparatus 10 can be directly substituted into the parameters $S_{11AT}$, $S_{22AT}$, $S_{21AT}$, and $S_{12AT}$ of formulas (13) and (14) to obtain the values of the error terms $E_{TF}$ and $E_{TR}$. Accordingly, twelve error terms can be obtained.

Then, the signal measurer 10 is connected to the DUT 50 to obtain one or more groups of device-under-test measurement values related to the device under test, and the formulas (1)-(4) are solved simultaneously to obtain the real S parameter (i.e., the property value of the device under test) of the DUT 50.

$$S_{11A} = \frac{(1 + D \cdot E_{SR}) \cdot A - E_{LF} \cdot B \cdot C}{(1 + A \cdot E_{SF}) \cdot (1 + D \cdot E_{SR}) - E_{LR} \cdot E_{LF} \cdot B \cdot C} \quad (15)$$

$$S_{22A} = \frac{(1 + A \cdot E_{SF}) \cdot D - E_{LR} \cdot B \cdot C}{(1 + A \cdot E_{SF}) \cdot (1 + D \cdot E_{SR}) - E_{LR} \cdot E_{LF} \cdot B \cdot C} \quad (16)$$

$$S_{21A} = \frac{(1 + D \cdot (E_{SR} - E_{LF})) \cdot B}{(1 + A \cdot E_{SF}) \cdot (1 + D \cdot E_{SR}) - E_{LR} \cdot E_{LF} \cdot B \cdot C} \quad (17)$$

$$S_{12A} = \frac{(1 + A \cdot (E_{SF} - E_{LR})) \cdot C}{(1 + A \cdot E_{SF}) \cdot (1 + D \cdot E_{SR}) - E_{LR} \cdot E_{LF} \cdot B \cdot C} \quad (18)$$

$$A = \frac{S_{11M} - E_{DF}}{E_{RF}}, B = \frac{S_{21M} - E_{XF}}{E_{TF}},$$

$$C = \frac{S_{12M} - E_{XR}}{E_{TR}}, \text{ and } D = \frac{S_{22M} - E_{DR}}{E_{RR}}.$$

If the error terms are substituted into formulas (15)-(18), respectively, the property values of the device under test (DUT) can be obtained as the actual property of the device under test.

Figure 8:
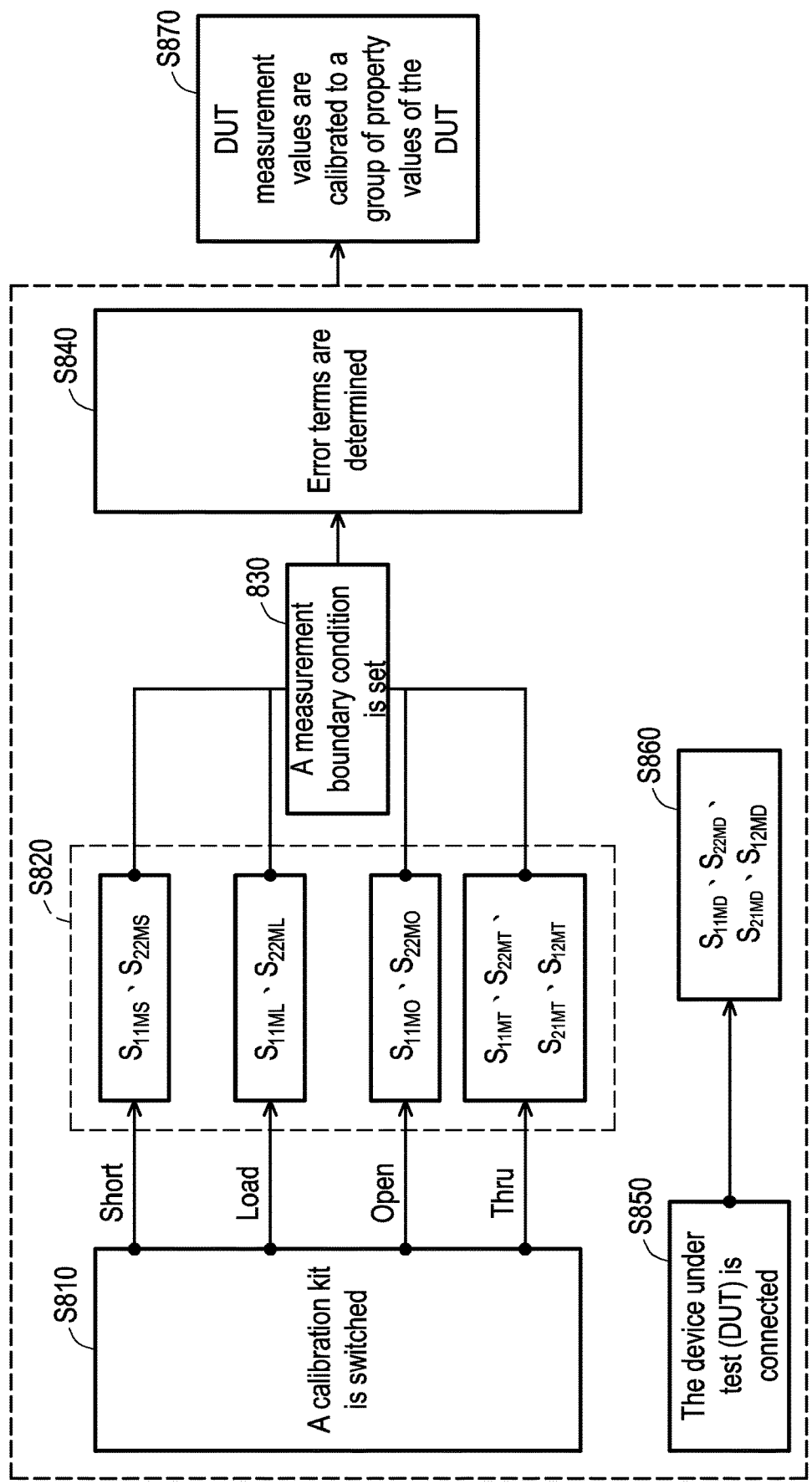
FIG. 8 is a flowchart illustrating a short-open-load-thru (SOLT) calibration process according to an embodiment of the disclosure.

FIG. 8 is a flowchart illustrating a short-open-load-thru (SOLT) calibration process according to an embodiment of the disclosure. Referring to FIG. 8, the short circuit calibration kit, load calibration kit, open circuit calibration kit, and through connection calibration kit (step S810) (i.e., the measuring ports are connected to different calibration kits) are switched, and one or more groups of calibration kit measurement values (e.g., parameters $S_{11MS}$, $S_{22MS}$, $S_{11ML}$, $S_{22ML}$, $S_{11MO}$, $S_{22MO}$, $S_{11MT}$, $S_{22MT}$, $S_{21MT}$, $S_{12MT}$) of each calibration kit (step S820) are obtained. According to the calibration kit measurement value and/or the theoretical model, the ideal boundary condition is set (step S830), and then the error terms can be obtained. The error terms can be used to build error models. On the other hand, by connecting the DUT 50 (step S850), the signal measurement apparatus 10 can obtain one or more groups of device-under-test measurement values (e.g., parameters $S_{11MD}$, $S_{22MD}$, $S_{21MD}$, $S_{12MD}$) (step S860). The signal measurement apparatus 10 can calibrate the device-under-test measurement values according to the error model based on the error terms to obtain one or more groups of property values (e.g., S parameters $S_{11AD}$, $S_{22AD}$, $S_{21AD}$, $S_{12AD}$) (i.e., the device-under-test measurement values are calibrated to the property value of the device under test) of the device under test (step S870).

In an embodiment, the broadband measurement systems 1 may further include a controller (not shown). The controller can be coupled to the signal measurement apparatus 10 and/or the signal converter 30. In an embodiment, the controller may be configured to control the range of the second frequency domain and read the measurement data (e.g., the calibration kit measurement value and/or the measurement value of the device under test) from the signal measurement apparatus 10.

In an embodiment, the controller may be further configured to obtain the one or more error models according to the calibration kit measurement value. The establishment of the error model can refer to the derivation of the formulas (1)-(14), which is not be repeated herein.

In an embodiment, the controller may issue instructions or directly output data from the signal measurement apparatus 10 to control the signal measurement apparatus 10 to obtain the calibration kit measurement value related to the calibration kit and/or the device-under-test measurement value related to the DUT 50.

In an embodiment, the controller can calibrate the device-under-test measurement value to the property value of the device under test according to the error model based on the error terms. For example, according to formulas (15)-(18), the actual S parameters can be obtained.

In one embodiment, the controller can switch the calibration kit connected to the signal measurement apparatus 10 and/or the signal converter 30 according to the calibration process. For example, the controller provides switches connected to each calibration kit, respectively, turns on the signal measurement apparatus 10 and/or the signal converter 30 connected to the corresponding calibration kit according to the calibration item, and interrupts the connection between other calibration kits and the signal measurement apparatus 10 and/or signal conversion the devices 30, but the disclosure is not limited thereto.

Note that the calibration process is illustrated by taking the SOLT as an example. In other embodiments, the calibration process can also be a short open load reciprocal (SOLR) process, a line reflect match (LRM) process, a line reflect match (LRM) process, a line reflect reflect match (LRRM) process, a thru reflect line (TRL) process, or other calibration processes.

In an embodiment, the system 1 further includes a storage medium coupled to the controller. The storage medium can be a hard disk, a memory, a flash drive, database, or a server. In one embodiment, the storage medium is configured to store the error model and/or one or more groups of device-under-test measurement values, and the controller or other devices can read or write them. For example, the controller stores the error model to the storage medium, or the controller reads the device-under-test measurement values from the storage medium.

Based on the analysis of the error model, it can be applied to the calibration of other reference planes.

Figure 9:
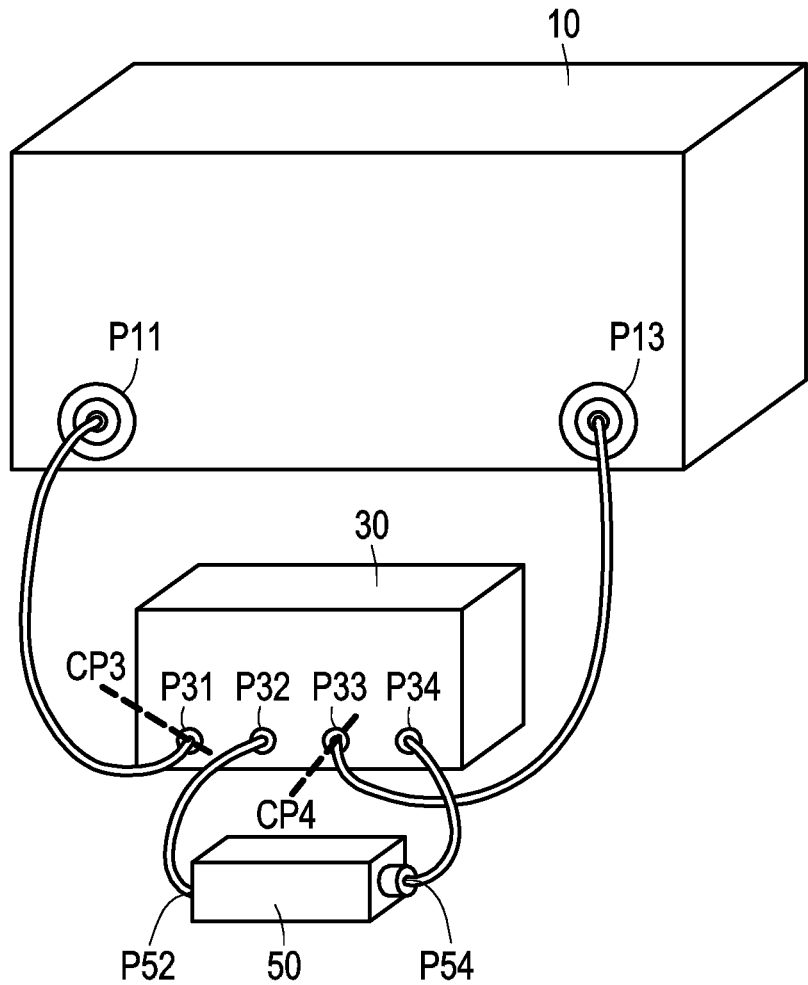
FIG. 9 is a schematic view of calibration reference planes according to an embodiment of the disclosure.

FIG. 9 is a schematic view of calibration reference planes CP3 and CP4 according to an embodiment of the disclosure. Referring to FIG. 9, the calibration reference plane CP3 is located at the port P31 of the signal converter 30, and the calibration reference plane CP4 is located at the port P33 of the signal converter 30. The signal measurement apparatus 10 can perform a calibration process based on the calibration reference planes CP3 and CP4 to obtain an error model.

In the calibration process of the embodiment, the signal measurement apparatus 10 is electrically connected to one side (e.g., the ports P31 and P33) of the signal converter through the measuring ports P11 and P13, respectively, and one or more calibration kits are electrically connected to one side (e.g., the ports P32 and P34) of the signal converter 30 to obtain one or more groups of calibration kit measurement values related to the calibration kit by performing the calibration process. Then, the signal measurement apparatus 30 is electrically connected to the DUT 50 (as shown in FIG. 9) through the signal converter 10 to obtain one or more groups of device-under-test measurement values related to the DUT 50. Finally, the device-under-test measurement values is calibrated into one or more groups of property values of the device under test according to the error model.

Figure 10:
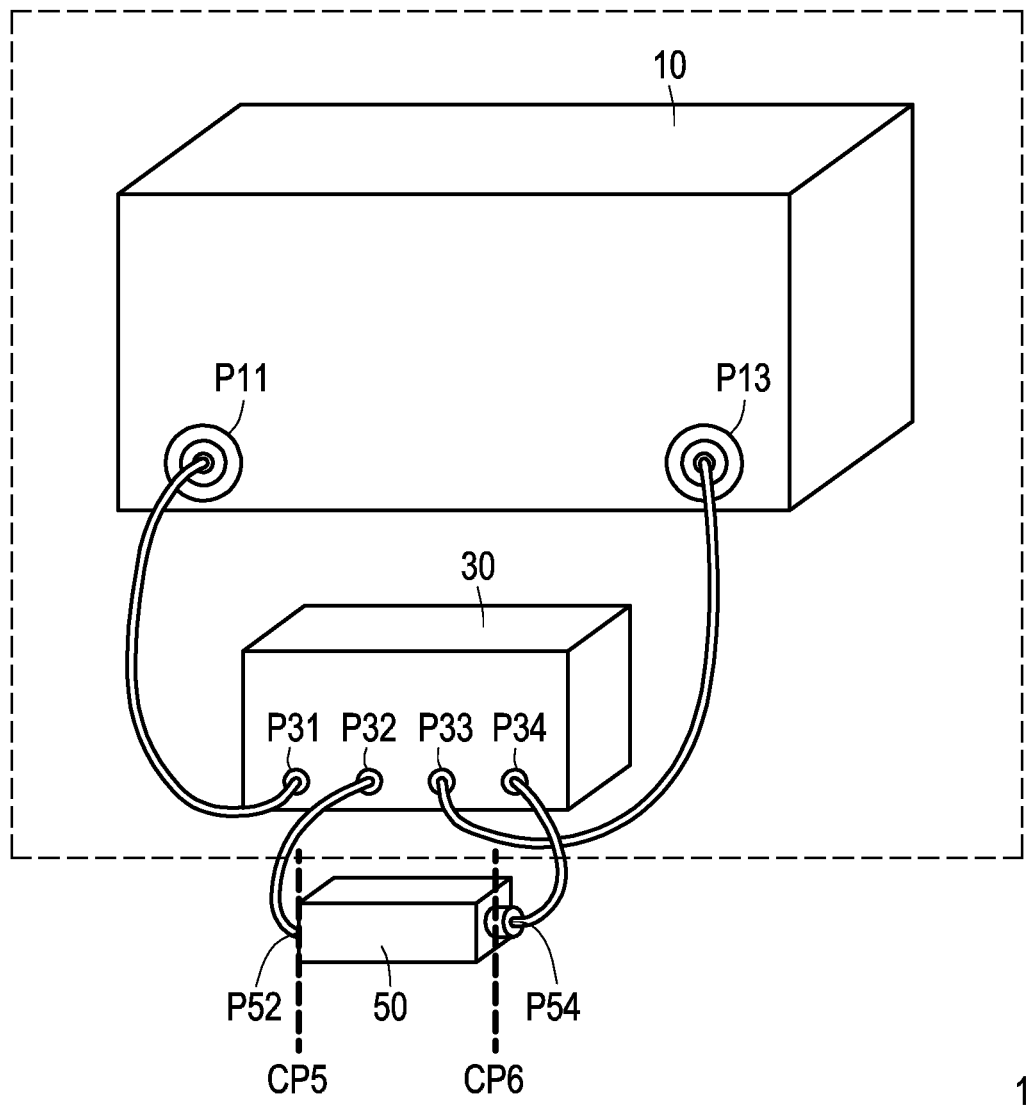
FIG. 10 is a schematic view of calibration reference planes according to an embodiment of the disclosure.

FIG. 10 is a schematic view of calibration reference planes CP5 and CP6 according to an embodiment of the disclosure. Referring to FIG. 10, the calibration reference plane CP5 is located at the port under test P52 under test of the port P32 of the DUT 50, and the calibration reference plane CP6 is located at the other port under test P54 of the port P34 of the DUT 50. The signal measurement apparatus 10 can perform a calibration process based on the calibration reference planes CP3 and CP4 to obtain an error model.

In the calibration process of the embodiment, the signal measurement apparatus 10 is electrically connected to one side (e.g., the ports P31 and P33) of the signal converter through the measuring ports P11 and P13, respectively, and one or more calibration kits are electrically connected to one side (e.g., one end of the connection line used to be connected to the ports under test P52 and P54) of the signal converter 30 to obtain one or more groups of calibration kit measurement values related to the calibration kit by performing the calibration process. Then, the signal measurement apparatus 10 is electrically connected to the DUT 50 through the signal converter 30 (as shown in FIG. 10) to obtain one or more groups of the device-under-test measurement values related to the DUT 50. Finally, the device-under-test measurement values is calibrated into one or more groups of property values of the device under test (DUT) according to the error model.

In the subsequent paragraphs, for the architecture of FIG. 9 and FIG. 10, the measurement boundary conditions are set and substituted into the formulas, and the data results are compared accordingly.

Figure 11:
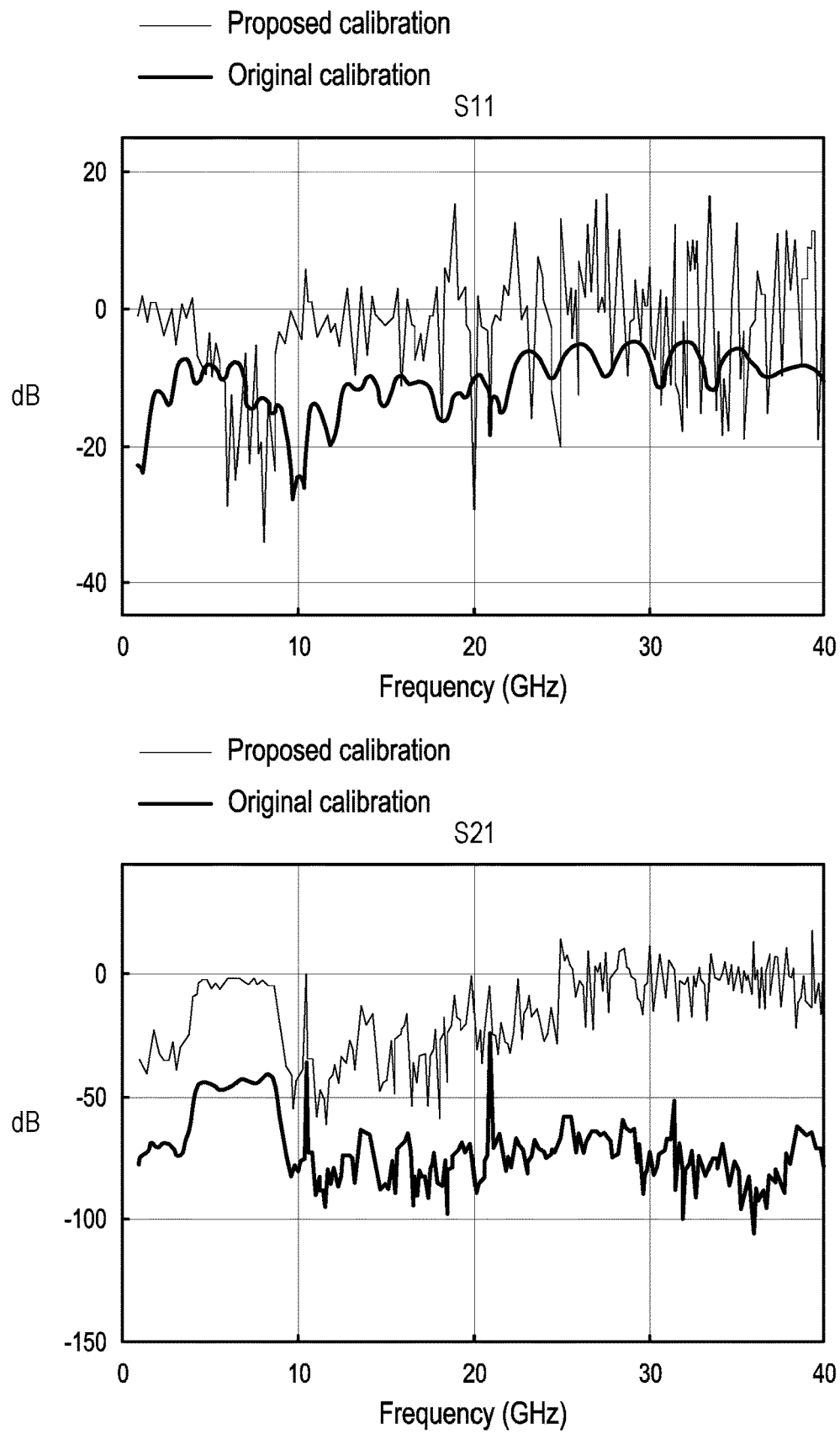
FIG. 11 is the verification result of FIG. 9.
Figure 12:
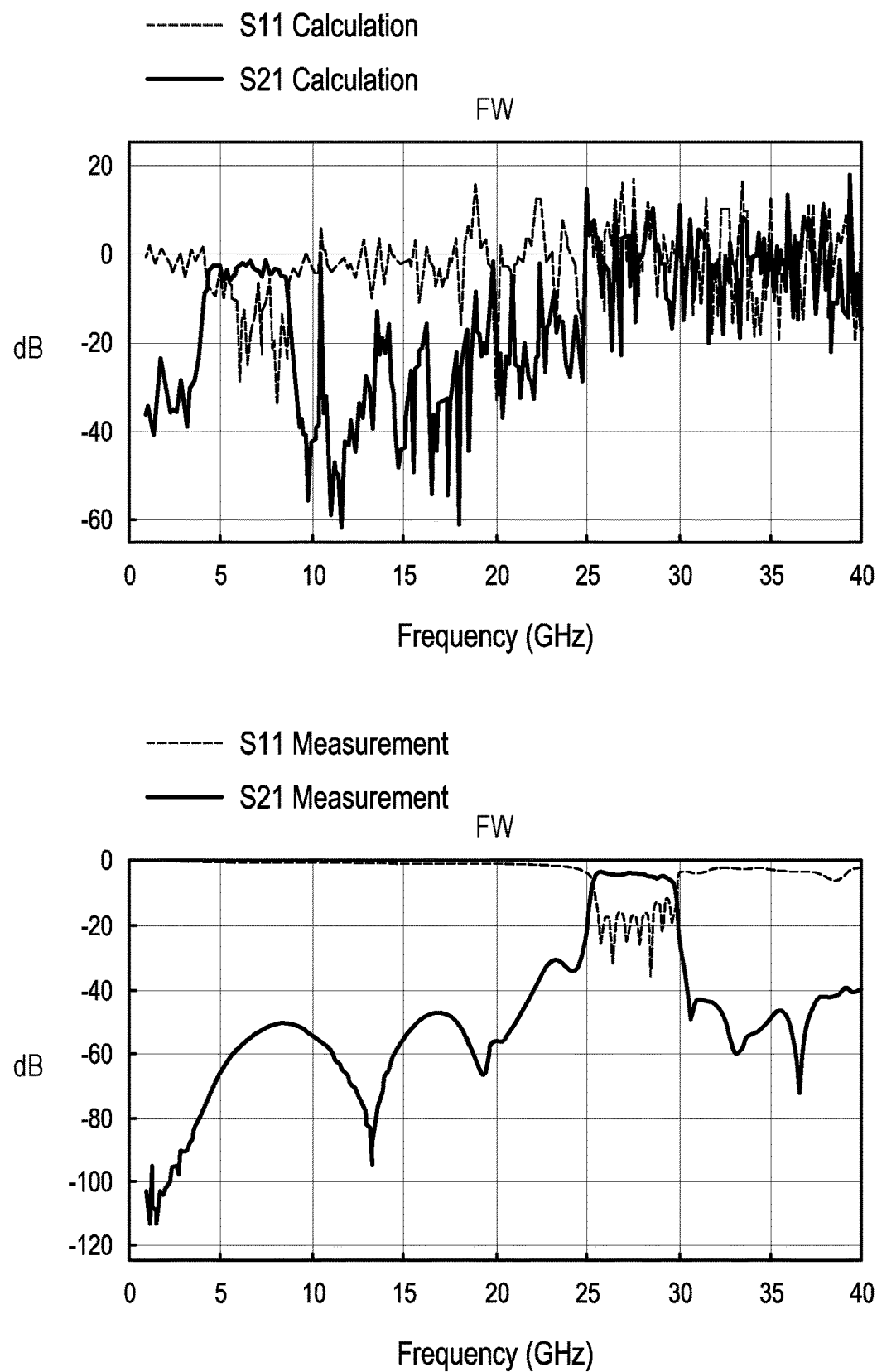
FIG. 12 is the measurement result of the device under test (DUT) measured in FIG. 9 and FIG. 3.
Figure 13:
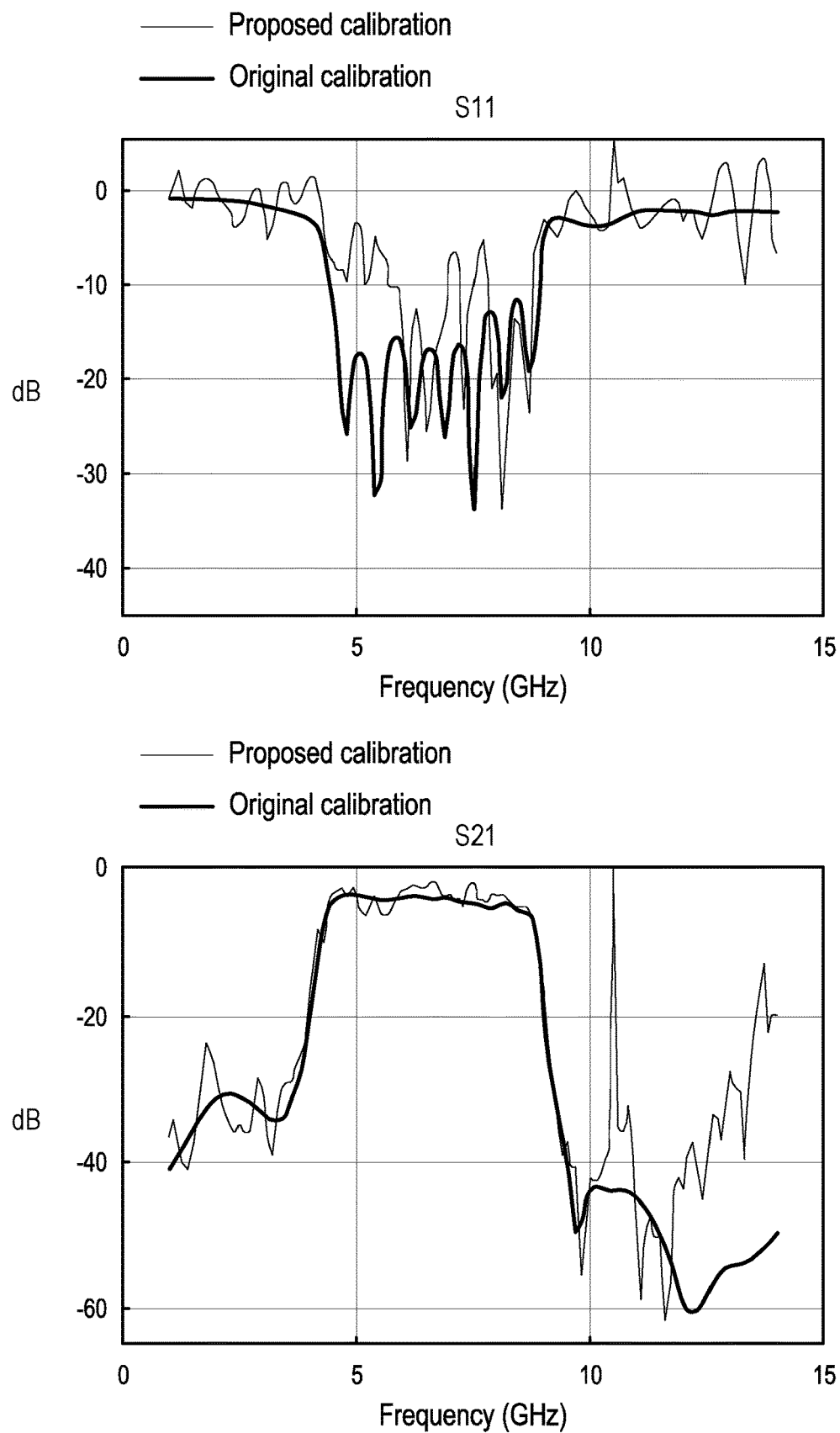
FIG. 13 is a partial enlarged view of FIG. 11.

FIG. 11 is the verification result of FIG. 9, FIG. 12 is the measurement result of the DUT 50 measured in FIG. 9 and FIG. 3, and FIG. 13 is a partial enlarged view of FIG. 11. Referring to FIG. 11-FIG. 13, in the drawings, the thick lines (i.e., the original calibration) are curves that are generally suitable for ultra-wideband vector network analyzer (VNA) measurement and then its spectrum is translated, and the thin lines (i.e., the proposed calibration) are curves of the system and the method proposed by the embodiment of the disclosure. According to the drawings, the calibration proposed by the embodiment of the disclosure is almost overlapped with the result obtained by using the ultra-wideband vector network analyzer.

Figure 14:
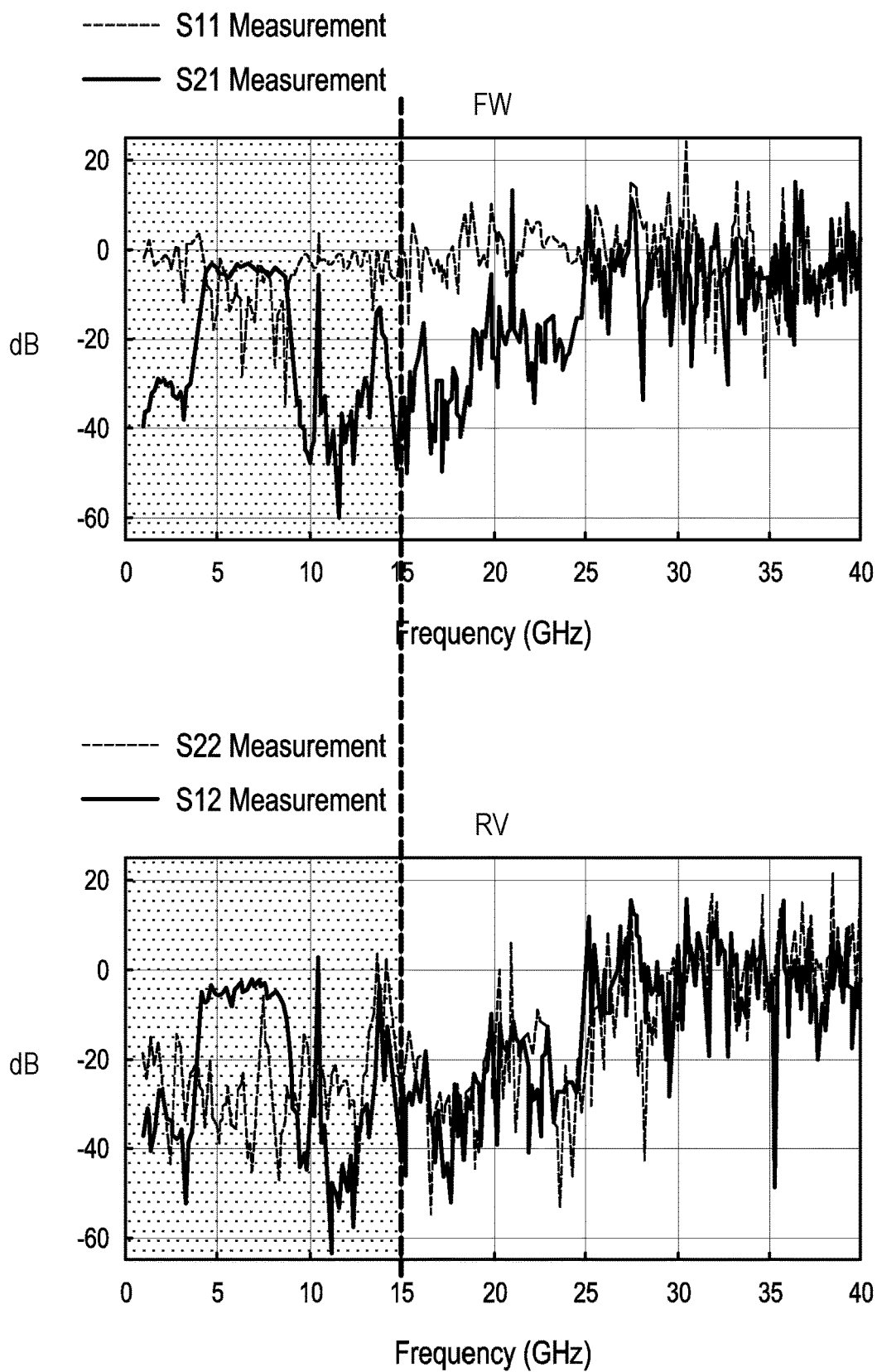
FIG. 14 is the measurement result of FIG. 10.
Figure 15:
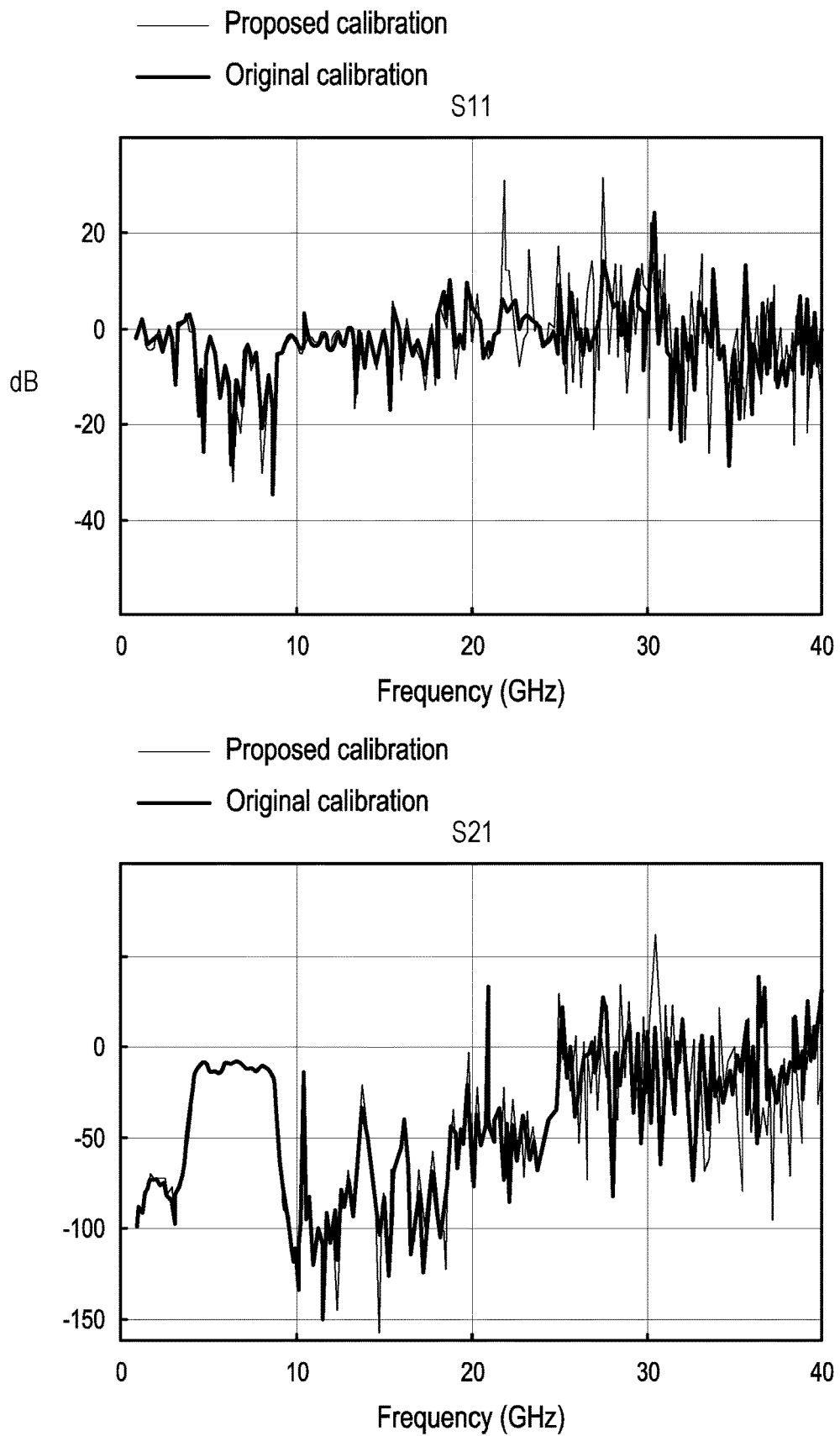
FIG. 15 is the verification result of FIG. 10.
Figure 16:
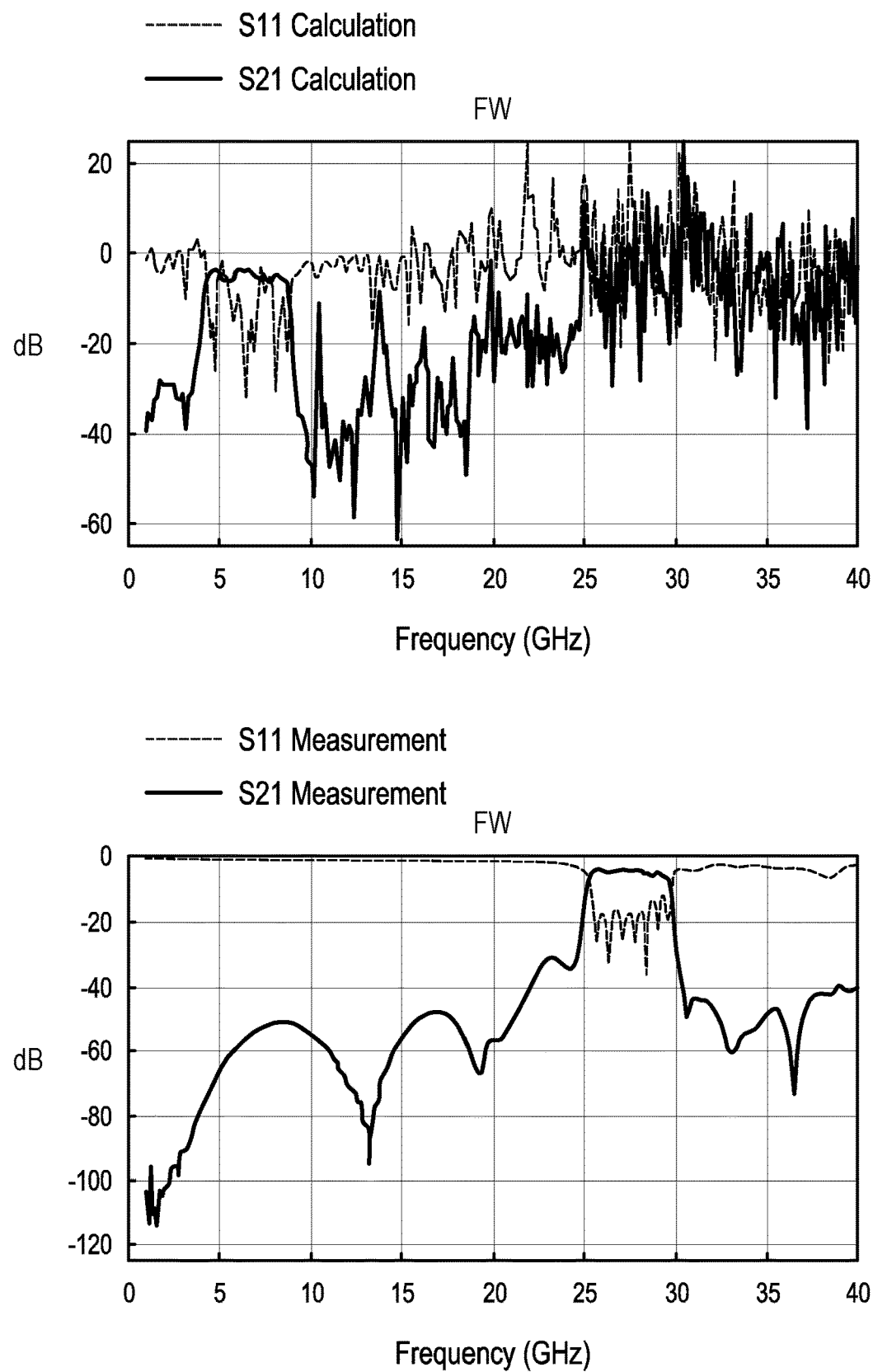
FIG. 16 is the measurement result of the device under test (DUT) measured in FIG. 10 and FIG. 3.
Figure 17:
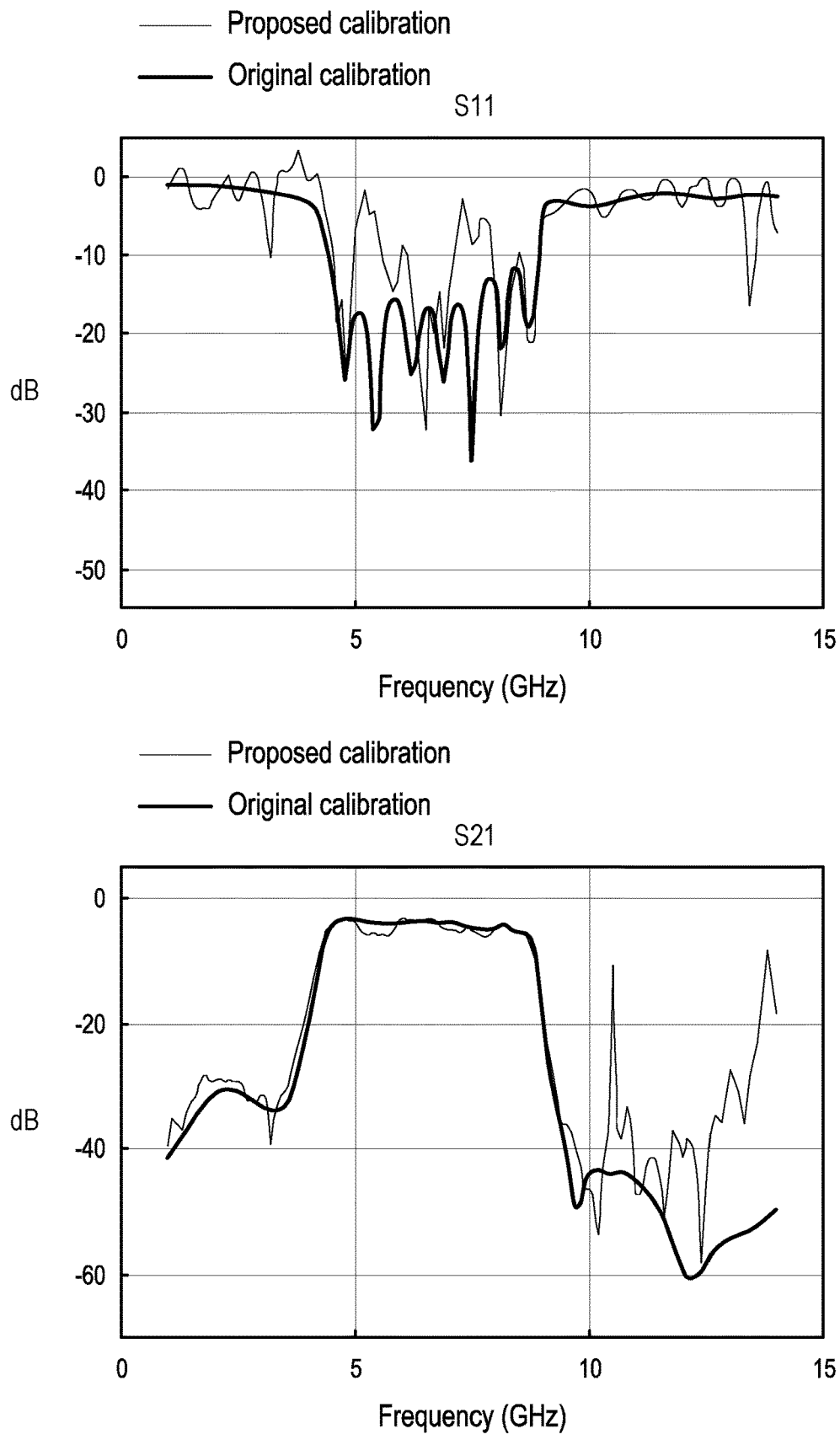
FIG. 17 is a partial enlarged view of FIG. 15.

FIG. 14 is the measurement result of FIG. 10, FIG. 15 is the verification result of FIG. 10, FIG. 16 is the measurement result of the DUT 50 measured in FIG. 10 and FIG. 3, and FIG. 17 is a partial enlarged view of FIG. 15. Referring to FIG. 14-FIG. 17, in the drawings, the thick lines (i.e., the original calibration) are curves that are generally suitable for ultra-wideband vector network analyzer (VNA) measurement and then its spectrum is translated, and the thin lines (i.e., the proposed calibration) are curves of the system and the method proposed by the embodiment of the disclosure. According to the drawings, the calibration proposed by the embodiment of the disclosure is almost overlapped with the result obtained by using the ultra-wideband vector network analyzer.

Figure 18:
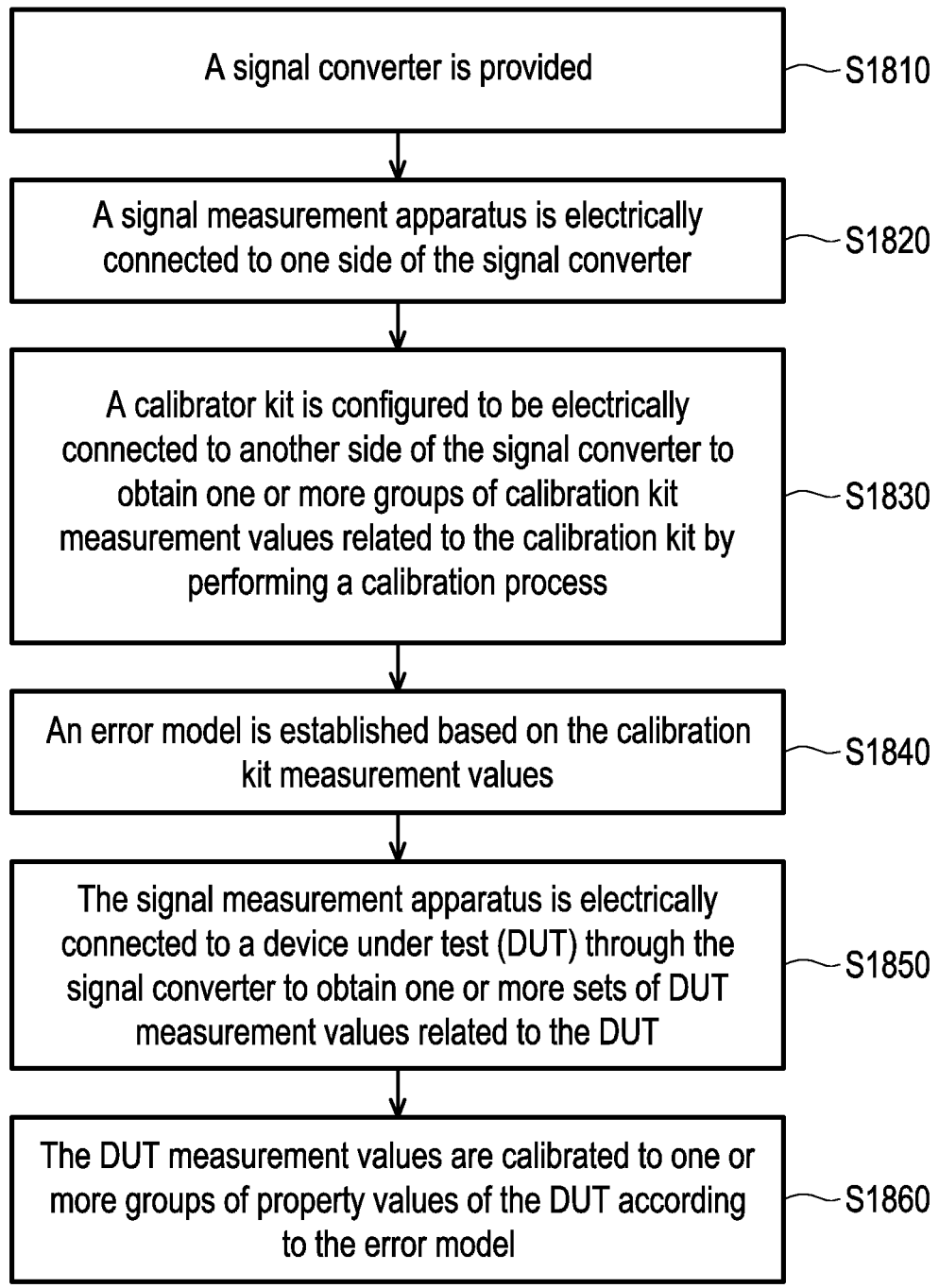
FIG. 18 is a flowchart illustrating a measurement method for broadband property according to an embodiment of the disclosure.

FIG. 18 is a flowchart of a measurement method for broadband property according to an embodiment of the disclosure. Referring to FIG. 18, the signal converter 30 as shown in FIG. 1 and FIG. 2 is provided (step S1810). The signal measurement apparatus 10 is electrically connected to one side (e.g., the ports P11 and P13 in FIG. 1) of the signal converter 30 (step 1820). The calibration kit is electrically connected to the other side (e.g., the ports P32 and P34 in FIG. 1) of the signal converter 30 to obtain one or more groups of calibration kit measurement values related to the calibration kit by performing the calibration process (step S1830). An error model is established based on the calibration kit measurement value (step S1840). The signal measurement apparatus 10 is electrically connected to the DUT 50 through the signal converter 30 to obtain one or more groups of the device-under-test measurement values related to the DUT 50 (step S1850). The device-under-test measurement values are calibrated to one or more groups of property values of the device under test according to the error model (step S1860).

In one embodiment, the calibration reference plane CP3 is disposed at the port P31, the calibration reference plane CP4 is disposed at the port P33, and the calibration process is performed according to the calibration reference planes CP3 and CP4.

In one embodiment, the calibration reference plane CP5 is disposed to the port under test P52 of the port P32 of the DUT 50, and the calibration reference plane CP6 is disposed to the other port under test P54 of the port P34 of the DUT 50. The calibration processes are performed according to the calibration reference planes CP5 and CP6.

In one embodiment, in step S1840, some of the calibration kit measurement values are set according to the theoretical model to establish an error model. That is, in the three steps of SOL in the calibration process, $S_{21A}$ and $S_{12A}$ are set 0, and open circuit is set: $S_{11AO}=S_{22AO}\cong 1$; short circuit is set: $S_{11AS}=S_{22AS}\cong -1$.

In another embodiment, in step S1840, some of the calibration kit measurement values are set according to the parameters of the calibration kit to establish an error model. That is, due to the signal leakage or coupling effect of the calibration kit, or the parasitic effect of the components, and failing to achieve a substantial open circuit or short circuit, some calibration kits may provide their actual SOLT measurement values or a look-up table (LUT) of the frequency corresponding to their non-ideal effects. In the embodiment, this look-up table replaces the ideal assumption in the previous embodiment for calibration.

For the detailed description of the foregoing steps, refer to the description of FIG. 1 to FIG. 10, which is not be repeated herein.

In one embodiment, when the frequency reference given by the signal converter 30 is different, the properties of the DUT 50 obtained by the calibration may deviate. Therefore, the frequency conversion value of the signal converter 30 can be controlled through the input interface provided by the controller or the signal converter 30. For example, the frequency conversion value converted from the first frequency domain to the second frequency domain, or the frequency conversion value converted from the first frequency domain to the second frequency domain. This frequency conversion value is related to the frequency of the reference signal output by the signal generator CG. Then, the signal measurement apparatus 10 can be controlled to sweep frequencies to obtain multiple groups of calibration kit measurement values related to the calibration kit and the frequency conversion value. For example, different frequencies (may be several main stable frequencies or may also be changed according to other requirements) are sequentially set for the reference signal, and the calibration kit measurement values corresponding to one or more calibration kits are obtained, respectively. The foregoing steps may be performed multiple times, but the disclosure is not limited thereto.

In summary, in the broadband measurement system and the measurement method for broadband property of the embodiments of the disclosure, a signal converter for frequency up or down conversion is introduced into the system. The signal converter provides dual-port connected to the signal measurement apparatus and provides another dual-port connected to the device under test (DUT). The passive mixer is configured as bidirectional. Accordingly, the low-frequency network analyzer can implement high-frequency measurement. Furthermore, according to the embodiments, those with ordinary knowledge in the art should understand that the signal converter (dual-channel two-way passive up-down frequency converter) disclosed by the disclosure can be promoted as a multi-channel two-way passive up-down frequency converter.

What is claimed is:

1. A broadband measurement system, comprising:
   a signal measurement apparatus comprising a first measuring port and a second measuring port, wherein the signal measurement apparatus is configured to send a measuring signal from the first measuring port or the second measuring port, a frequency of the measuring signal belongs to a first frequency domain; and
   a signal converter, comprising:
   a first port configured to be connected to the first measuring port of the signal measurement apparatus;
   a second port;
   a first passive mixer coupled between the first port and the second port and configured as bidirectional;
   a third port configured to be connected to the second measuring port of the signal measurement apparatus;
   a fourth port; and
   a second passive mixer coupled between the third port and the fourth port and configured as bidirectional;
   wherein the first passive mixer and the second passive mixer are configured to:
   convert a signal received from the first port and a signal received from the third port to a second frequency domain, respectively and output from the second port and the fourth port, respectively; and
   convert a signal received from the second port and a signal received from the fourth port to the first frequency domain, respectively and output from the first port and the third port, respectively.

2. The broadband measurement system according to claim 1, wherein the signal converter further comprises a signal generator coupled to the first passive mixer and the second passive mixer, respectively.

3. The broadband measurement system according to claim 1, further comprising a controller coupled to the signal measurement apparatus and the signal converter, wherein the controller is configured to control a range of the second frequency domain and read measurement data from the signal measurement apparatus.

4. The broadband measurement system according to claim 3, further comprising a storage medium coupled to the controller.

5. The broadband measurement system according to claim 4, wherein in a calibration process, the second port and the fourth port are electrically connected to a calibration kit, the controller obtains a group of calibration kit measurement values related to the calibration kit through the signal measurement apparatus, the controller further obtains an error model according to the group of the calibration kit measurement values, and the error model is stored in the storage medium.

6. The broadband measurement system according to claim 4, wherein in a measurement process, the second port and/or the fourth port are electrically connected to a device under test (DUT), the controller controls the signal measurement apparatus to obtain at least one group of device-under-test measurement values related to the device under test, and at least one group of property values of the device under test related to the device under test is obtained according to an error model stored in the storage medium and the at least one group of device-under-test measurement values.

7. A measurement method for broadband property, comprising:
- providing a signal converter according to claim 1;
- configuring a signal measurement apparatus connected to one side of the signal converter;
- configuring a calibration kit electrically connected to another side of the signal converter to obtain at least one group of calibration kit measurement values related to the calibration kit by performing a calibration process;
- establishing an error model based on the at least one group of the calibration kit measurement values;
- configuring the signal measurement apparatus electrically connected to a device under test (DUT) through the signal converter to obtain at least one group of device-under-test measurement values related to the device under test; and
- calibrating the at least one group of the device-under-test measurement values to at least one group of property values of the device under test according to the error model.

8. The measurement method for broadband property according to claim 7, wherein the calibration process is a short/open/load/through (SOLT) process, a short open load reciprocal (SOLR) process, a line reflect match (LRM) process, a line reflect reflect match (LRRM) process, or a thru reflect line (TRL) process.

9. The measurement method for broadband property according to claim 7, wherein in the step of establishing the error model based on the at least one group of the calibration kit measurement values, some of the at least one group of the calibration kit measurement values are set according to parameters of the calibration kit to establish the error model.

10. The measurement method for broadband property according to claim 7, wherein in the step of establishing the error model based on the at least one group of the calibration kit measurement values, some of the at least one group of the calibration kit measurement values are set according to a theoretical model to establish the error model.

11. The measurement method for broadband property according to claim 7, wherein the step of configuring the calibration kit electrically connected to another side of the signal converter to obtain the at least one group of the calibration kit measurement values related to the calibration kit by performing the calibration process comprises:
- controlling a frequency conversion value of the signal converter; and
- controlling the signal measurement apparatus to sweep frequencies to obtain multiple groups of calibration kit measurement values related to the calibration kit and the frequency conversion value.

\* \* \* \* \*